United States Patent
Misaka

(10) Patent No.: US 7,771,902 B2
(45) Date of Patent: Aug. 10, 2010

(54) PHOTOMASK, FABRICATION METHOD FOR THE SAME AND PATTERN FORMATION METHOD USING THE SAME

(75) Inventor: Akio Misaka, Osaka (JP)

(73) Assignee: Panasonic Corporation, Osaka (JP)

( * ) Notice: Subject to any disclaimer, the term of this patent is extended or adjusted under 35 U.S.C. 154(b) by 427 days.

(21) Appl. No.: 11/884,451

(22) PCT Filed: Feb. 27, 2007

(86) PCT No.: PCT/JP2007/053604

§ 371 (c)(1),
(2), (4) Date: Aug. 16, 2007

(87) PCT Pub. No.: WO2007/102338

PCT Pub. Date: Sep. 13, 2007

(65) Prior Publication Data
US 2009/0208851 A1    Aug. 20, 2009

(30) Foreign Application Priority Data
Mar. 9, 2006  (JP) .............................. 2006-063753

(51) Int. Cl.
G03F 1/00    (2006.01)
H01L 21/00   (2006.01)
(52) U.S. Cl. .......................................... 430/5; 430/311
(58) Field of Classification Search ................ 430/5
See application file for complete search history.

(56) References Cited

U.S. PATENT DOCUMENTS

| 6,653,028 | B2 | 11/2003 | Lee et al. |
| 2001/0049064 | A1 | 12/2001 | Lee et al. |
| 2002/0039692 | A1 | 4/2002 | Tanaka |
| 2004/0121244 | A1 | 6/2004 | Misaka |
| 2004/0265708 | A1* | 12/2004 | Misaka ......................... 430/5 |
| 2006/0183030 | A1 | 8/2006 | Nakao |

FOREIGN PATENT DOCUMENTS

| JP | 7-219207 | 8/1995 |
| JP | 2001-142195 | 5/2001 |
| JP | 2002-055364 | 2/2002 |
| JP | 2002-107909 | 4/2002 |
| JP | 2004-070040 | 3/2004 |
| JP | 2006-221078 | 8/2006 |
| WO | WO 03/062923 A1 | 7/2003 |

* cited by examiner

*Primary Examiner*—Mark F Huff
*Assistant Examiner*—Jonathan Jelsma
(74) *Attorney, Agent, or Firm*—McDermott Will & Emery LLP

(57) ABSTRACT

A mask pattern including, for example, a light-shielding portion 101 and a first transparent portion 104A surrounded with a semi-light-shielding portion 102 are provided on a transparent substrate 100. The mask pattern includes a first pattern region and a second pattern region opposing each other with the semi-light-shielding portion 102 and the first transparent portion 104A sandwiched therebetween.

29 Claims, 26 Drawing Sheets

[Type1]

[Type2]

[Type1]

[Type2]

[Type3]

[GENERAL EXPOSURE
LIGHT SOURCE]

[ANNULAR EXPOSURE
LIGHT SOURCE]

[QUADRUPOLE EXPOSURE
LIGHT SOURCE]

[ANNULAR/QUADRUPOLE
EXPOSURE LIGHT SOURCE]

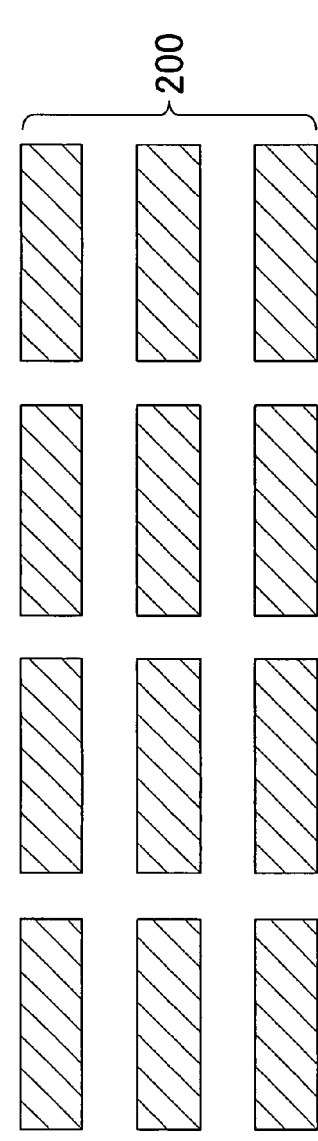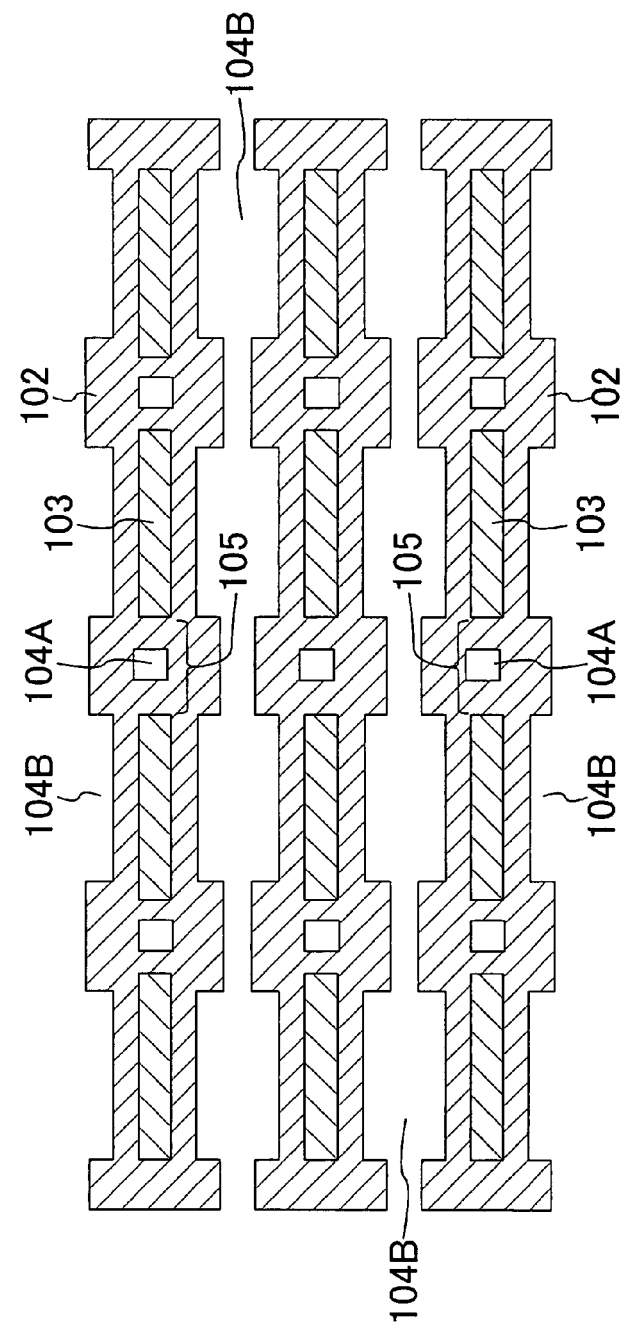
FIG. 28A
FIG. 28B

PHOTOMASK, FABRICATION METHOD FOR THE SAME AND PATTERN FORMATION METHOD USING THE SAME

RELATED APPLICATIONS

This application is the U.S. National Phase under 35 U.S.C. §371 of International Application No. PCT/JP2007/053604, filed on Feb. 27, 2007, which in turn claims the benefit of Japanese Application No. 2006-063753, filed on Mar. 9, 2006, the disclosures of which Applications are incorporated by reference herein.

TECHNICAL FIELD

The present invention relates to a photomask for use in forming a fine pattern in fabrication of a semiconductor integrated circuit device or the like and a pattern formation method using the photomask.

BACKGROUND ART

Recently, there are increasing demands for further refinement of circuit patterns for increasing the degree of integration of a large scale integrated circuit device (hereinafter referred to as the LSI) realized by using semiconductor. As a result, it has become very significant to thin an interconnect pattern included in a circuit.

Now, the thinning of an interconnect pattern by a conventional optical exposure system will be described on the assumption that positive resist process is employed. In this case, a line pattern means a portion of a resist film not exposed to exposing light, namely, a resist portion (a resist pattern) remaining after development. Also, a space pattern means a portion of the resist film exposed to the exposing light, namely, an opening portion (a resist removal pattern) formed by removing the resist film through the development. In the case where negative resist process is employed instead of the positive resist process, the definitions of the line pattern and the space pattern are replaced with each other.

When a pattern is formed by using the optical exposure system, a photomask in which a light-shielding pattern of Cr (chromium) or the like is drawn in accordance with a desired pattern on a transparent substrate (a substrate having a transparent property) of quartz or the like is conventionally used. In such a photomask, a region where the Cr pattern exists is a light-shielding portion that does not transmit exposing light of a given wavelength at all (having transmittance of substantially 0%) and a region where no Cr pattern exists (an opening) is a transparent portion that has transmittance equivalent to that of the transparent substrate (having transmittance of substantially 100%) against the exposing light. At this point, all mask patterns are drawn on the transparent substrate, and in the pattern exposure, the transparent substrate is irradiated from a back side (i.e., a side where the mask patterns are not provided), and therefore, the mask patterns are irradiated with the exposing light having passed through the transparent substrate. Accordingly, when the transmittance of a mask pattern against exposing light is herein argued, the absolute transmittance of each portion of the mask pattern is not used but relative transmittance obtained on the basis of the transmittance of a transparent substrate against the exposing light (100%) is used.

In the case where the photomask as described above is used for the exposure of a wafer where a resist has been applied, an image of light having passed through the mask is projected onto the wafer. In this case, a light-shielding portion of the mask corresponds to an unexposed portion of the resist and an opening (transparent portion) of the mask corresponds to an exposed portion of the resist, so that a desired resist pattern can be formed on the wafer. Accordingly, such a photomask, namely, a photomask composed of a light-shielding portion and a transparent portion against exposing light of a given wavelength, is designated as a binary mask.

It is, however, difficult to accurately form a fine pattern smaller than the exposure wavelength (the wavelength of the exposing light) by using the binary mask because of the light diffraction phenomenon. This is for the following reason: Since the amplitude intensity of a diffraction image of light passing through the mask and projected onto a wafer is reduced, the proportion of zero-order light corresponding to non-diffracted light, namely, the proportion of a noise component in an optical image, is increased, and hence, a clear image cannot be obtained. As a result, a dimension error of a pattern provided on the mask is enhanced in the projected light image, which makes it difficult to form a pattern with desired dimensional accuracy. Such a phenomenon is designated as increase of MEF (mask error factor). In recent LSIs in which patterns are desired to be formed under highly accurate dimensional control, the reduction of the MEF is particularly a significant problem.

As another problem caused by the light diffraction phenomenon, there is a phenomenon that even when a mask pattern is formed in a rectangular shape, a resist pattern formed through exposure of the mask pattern has round corners. In particular, in the formation of a resist pattern in a thin line shape, the roundness of the corners of the resist pattern leads to a phenomenon that the line ends of the resist pattern are formed in a recess position. Such a phenomenon causes significant defect in integration of an LSI.

FIGS. 26A and 26B are diagrams for explaining harmful influence of the roundness of the resist pattern corners on the integration of an LSI. Specifically, FIG. 26A shows an exemplified layout pattern in which transistors are disposed. As shown in FIG. 26A, a gate layer pattern 12 corresponding to a gate electrode of a transistor is disposed on an active layer pattern 11 corresponding to an active region. Also, contact patterns 13 each corresponding to a contact connected to a source region or a drain region are disposed on both sides of the gate layer pattern 12 on the active layer pattern 11. At this point, in order to increase the degree of integration of an LSI by providing transistors at a high density, it is necessary to reduce a region sandwiched between gate layer patterns 12 corresponding to transistors adjacent to each other (hereinafter referred to as the "opposing region") and to reduce an external length of the gate layer pattern 12 extending beyond the active layer pattern 11 in the opposing region. Therefore, as shown in FIG. 26A, an external length A of the gate layer pattern 12 in the opposing region is smaller than an external length B of the gate layer pattern 12 in a region opposite to the opposing region (hereinafter referred to as the "non-opposing region").

FIG. 26B is a diagram in which resist patterns of respective layers formed through exposure of the patterns of the respective layers of the layout pattern of FIG. 26A are overlaid. Specifically, as shown in FIG. 26B, the shape of a resist pattern 21 corresponding to the active layer pattern 11, the shape of a resist pattern 22 corresponding to the gate layer pattern 12 and the shape of a resist pattern 23 corresponding to the contact pattern 13 are overlaid. Furthermore, as shown in FIG. 26B, in the resist pattern 22 corresponding to the gate layer pattern 12, line ends are rounded to be formed in recess positions as compared with the desired mask dimension (i.e., the dimension of the gate layer pattern 12). In this case, in the non-opposing region where the external length B of the gate layer pattern 12 is relatively large, a desired gate length LgO at the center of the active region is realized as a width along the gate length of the resist pattern 22 at the end of the active region. However, in the opposing region where the external length A of the gate layer pattern 12 is not sufficiently secured, a width Lg1 along the gate length of the resist pattern 22 at the end of the active region is smaller than the gate length LgO. When there is a part where a sufficient gate length cannot be secured at the end of the active region in this manner, a source-drain leakage current is increased in this part, and hence, the resultant LSI cannot be normally operated.

In this manner, when the phenomenon of the roundness of resist pattern corners occurs, it is difficult to reduce the opposing region sandwiched between gate layer patterns in a circuit layout in which a plurality of transistors are adjacent to one another and to reduce an external length of a gate in the opposing region. Therefore, it is a significant problem for the integration of an LSI to prevent the phenomenon of the roundness of resist pattern corners.

As a countermeasure for preventing the roundness of resist pattern corners, a method in which a pattern for shielding light is provided around each corner of a mask pattern has been proposed (for example, Patent Document 1). FIGS. 27A and 27B are diagrams for explaining a method disclosed in Patent Document 1, and specifically, a method in which a transmittance adjustment film is used for preventing the roundness of resist pattern corners. FIG. 27A is a diagram of a desired pattern to be formed through exposure. As shown in FIG. 27A, the desired pattern is a plurality of rectangular patterns 30 adjacent to one another. Also, FIG. 27B is a diagram for showing the plane structure of a photomask used for forming the desired pattern of FIG. 27A. It is noted that a transparent substrate is perspectively shown in FIG. 27B. As shown in FIG. 27B, light-shielding portions 51 corresponding to the desired pattern are provided on the transparent substrate 50. Furthermore, a transmittance adjustment film 53 is provided in each area 52 where transparent portions 54 cross each other between the light-shielding portions 51 (i.e., transparent portion crossing area). The transmittance adjustment film 53 is used for adjusting the quantity of light passing through the transparent portion 54, and when the transmittance adjustment film 53 is provided at the transparent portion crossing area 52, the quantity of light passing through this area 52 can be reduced. Thus, it is possible to prevent excessive light from passing through the transparent portion crossing area 52, so that a corner of a resist pattern corresponding to the transparent portion crossing area 52 and its periphery can be prevented from being rounded.

Patent Document 1: Japanese Laid-Open Patent Publication No. 7-219207

DISCLOSURE OF THE INVENTION

Problems to be Solved by the Invention

In the aforementioned method disclosed in Patent Document 1, namely, in the method in which a transmittance adjustment film is provided in a transparent portion crossing area, the roundness of resist pattern corners can be suppressed, however, the increase of MEF with respect to a dimension of an opposing region between resist patterns cannot be suppressed in forming fine patterns by this conventional technique. Therefore, it is difficult to reduce the opposing region between gate layer patterns, and hence, transistors cannot be disposed at a high density for realizing high integration of an LSI.

In consideration of the aforementioned problems, an object of the invention is providing a photomask by which the roundness of resist pattern corners can be suppressed and an MEF reducing effect can be attained in an opposing region of the pattern, and a pattern formation method using the photomask.

Means for Solving the Problem

In order to achieve the object, the photomask of this invention including a mask pattern provided on a transparent substrate having a transparent property against exposing light includes, on the transparent substrate, a semi-light-shielding portion for partially transmitting the exposing light; a first transparent portion surrounded with the semi-light-shielding portion and having a transparent property against the exposing light; and a second transparent portion surrounding the mask pattern and having a transparent property against the exposing light, the mask pattern includes a first pattern region and a second pattern region opposing each other with at least a part of the semi-light-shielding portion and the first transparent portion sandwiched therebetween, and the semi-light-shielding portion, the first transparent portion and the second transparent portion transmit the exposing light in an identical phase.

Furthermore, the method for fabricating the photomask of this invention is a method for fabricating the aforementioned photomask of this invention and includes the steps of (a) forming a semi-light-shielding film on the transparent substrate; (b) removing the semi-light-shielding film in a region for the first transparent portion, a region for the second transparent portion, the first pattern region and the second pattern region; and (c) forming the phase shifter portion by trenching the transparent substrate in the first pattern region and the second pattern region by a given depth after the step (b).

Moreover, the pattern formation method of this invention is a pattern formation method using the photomask of the invention and includes the steps of (a) forming a resist film on a substrate; (b) irradiating the resist film with the exposing light through the photomask; and (c) forming a resist pattern by developing the resist film having been irradiated with the exposing light.

EFFECT OF THE INVENTION

According to the present invention, since a semi-light-shielding portion is provided between a transparent portion disposed in an opposing region of a mask pattern and each pattern region, roundness of resist pattern corners and recess of an end derived from the roundness can be suppressed as well as MEF can be reduced also in the pattern opposing region. Accordingly, in the case where the present invention is applied to, for example, formation of a pattern having a circuit layout including a plurality of transistors adjacent to one another, an opposing region between gate layer patterns and an external length of a gate in the opposing region can be reduced, so that the transistors can be disposed at a high density for realizing high integration of an LSI.

BRIEF DESCRIPTION OF DRAWINGS

FIG. 28A is a diagram for showing the shape of a desired resist pattern to be formed by using a photomask according to Modification 3 of Embodiment 1 of the invention and FIG. 28B is a plan view of the photomask of Modification 3 of Embodiment 1 of the invention.

Figure 1A:
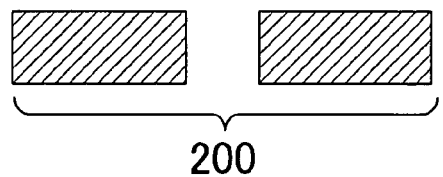
FIG. 1A is a diagram for showing the shape of a desired resist pattern to be formed by using a photomask according to Embodiment 1 of the invention.

DESCRIPTION OF REFERENCE NUMERALS 100 transparent substrate
101 light-shielding portion
102 semi-light-shielding portion
103 phase shifter portion
104A first transparent portion
104b second transparent portion
105 opposing region
110 quartz substrate
111 light-shielding film (Cr film)
112 semi-light-shielding film (metal thin film)
113 phase shifting film ($SiO_2$ film)
115 trench portion
119 resist pattern
121 resist film
121A resist pattern
122 resist film
122A resist pattern
123A resist pattern
150 transparent substrate
151 semi-light-shielding film
152 phase shifting film
153 light-shielding film
154 phase shifting film
160 transparent substrate
160a trench portion
161 semi-light-shielding film
162 light-shielding film
163 phase shifting film
164 phase shifting film
200 desired pattern
300 substrate
301 target film
302 resist film
302a latent image portion
303 exposing light
304 exposing light having passed through photomask
305 resist pattern

BEST MODE FOR CARRYING OUT THE INVENTION

Prerequisites

Prerequisites for describing preferred embodiments of the invention will be first described.

Since a photomask is generally used in a reduction projection type aligner, it is necessary to consider a reduction ratio in arguing a pattern dimension on the mask. However, in order to avoid confusion, in the description of each embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, also in the case where a resist pattern with a width of 100 nm is formed by using a mask pattern with a width of M×100 nm in a 1/M reduction projection system, the width of the mask pattern and the width of the resist pattern are both described as 100 nm.

Also, in each embodiment of the invention, M and NA respectively indicate a reduction ratio and numerical aperture of a reduction projection optical system of an aligner and λ indicates the wavelength of exposing light unless otherwise mentioned. Furthermore, in the case where a pattern dimension for attaining an effect related to any of various optical characteristics is defined in each embodiment of the invention, when merely the upper limit of the pattern dimension is mentioned, the lower limit of the pattern dimension is 0.02× λ/NA×M. This is for the following reason: When a pattern singly present has a dimension smaller than approximately 0.02×λ/NA×M, it is experimentally obvious that any significant optical characteristic effect cannot be attained by the pattern no matter whether the pattern is an opening or a light-shielding portion. For example, when it is described that a specific effect is attained by a pattern with a dimension not more than 0.8×λ/NA×M, it means that the range of the pattern dimension for attaining the specific effect is a range not less than 0.02×λ/NA×M and not more than 0.8×λ/NA×M.

Moreover, in each embodiment of the invention, pattern formation is described on the assumption that the positive resist process for forming a resist pattern correspondingly to an unexposed region of a resist is employed. In the case where negative resist process is employed instead of the positive resist process, since an unexposed region of a resist is removed in the negative resist process, a resist pattern of the positive resist process is replaced with a space pattern.

Moreover, it is assumed that a photomask described in each embodiment of the invention is a transmission mask. In the case where the present photomask is applied to a reflection mask instead of a transmission mask, since a transparent region and a light-shielding region of a transmission mask respectively correspond to a reflection region and a non-reflection region, the transmission phenomenon of a transmission mask is replaced with the reflection phenomenon. Specifically, a transparent substrate of a transmission mask is replaced with a substrate having, on its surface, a reflection film for reflecting exposing light, a transparent portion or a transparent region is replaced with a reflection portion or a reflection region, and a light-shielding portion is replaced with a non-reflection portion. Furthermore, a region partially transmitting light in a transmission mask is replaced with a region partially reflecting light in a reflection mask, and transmittance is replaced with reflectance. Also, a semi-light-shielding portion is replaced with a semi-reflection portion. It is noted that a phase shifter portion of a reflection mask is a portion for reflecting light so as to cause a phase difference from light reflected by a reflection portion.

Furthermore, in the case where transmittance of a mask pattern is argued in each embodiment, absolute transmittance of each portion of a mask pattern is not used but relative transmittance obtained on the basis of the transmittance (100%) of a transparent substrate against exposing light is used. Accordingly, in the case where the photomask is applied not to a transmission mask but to a reflection mask and the transmittance is replaced with the reflectance, absolute reflectance of each portion of a mask pattern is not used but relative reflectance obtained on the basis of the reflectance (100%), against exposing light, of a substrate having, on its surface, a reflection film is used.

Embodiment 1

A photomask according to Embodiment 1 of the invention will now be described with reference to the accompanying drawings.

Figure 1B:
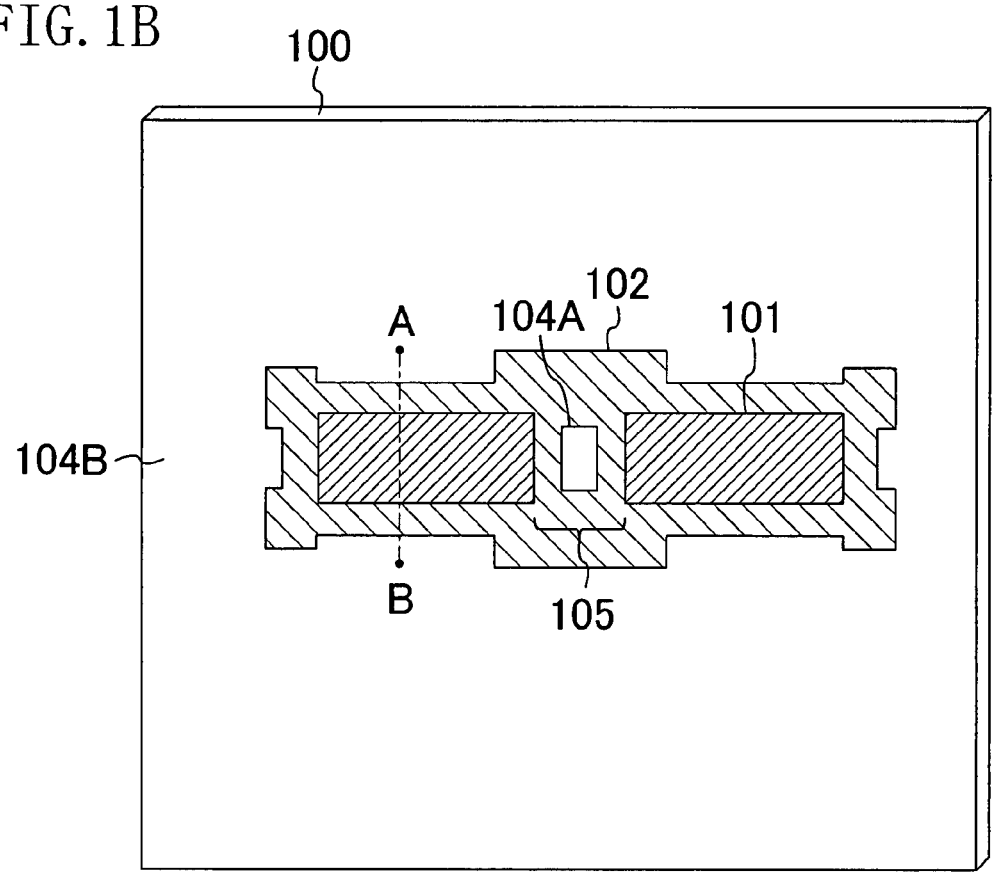
FIG. 1B is a plan view of the photomask of Embodiment 1 of the invention and FIG. 1C is a cross-sectional view of a portion corresponding to line AB of FIG. 1B.

FIG. 1A is a diagram for showing the shape of a desired resist pattern and FIG. 1B is a plan view of the photomask of Embodiment 1. It is noted that a transparent substrate is perspectively shown in FIG. 1B.

As shown in FIG. 1A, the desired pattern is a pair of rectangular resist patterns 200 opposing and close to each other.

As shown in FIG. 1B, a transparent portion 104 (a second transparent portion 104B) is provided over a sufficiently large area on the transparent substrate 100 in the photomask of this embodiment. Also, a mask pattern including a pair of rectangular light-shielding portions 101 is provided on the transparent substrate 100 in a position corresponding to the resist patterns (the desired pattern) 200 to be formed on a wafer through exposure. In this embodiment, the mask pattern corresponding to the resist patterns 200 includes a pair of pattern regions (a pair of light-shielding portions 101) opposing and close to each other. Also, as a characteristic of this embodiment, a semi-light-shielding portion 102 is provided between a first transparent portion 104A disposed in a region 105 sandwiched between the pair of pattern regions (i.e., a pattern opposing region) and each pattern region (i.e., each light-shielding portion 101). In other words, in the opposing region 105, the first transparent portion 104A is provided in a position away from each light-shielding portion 101 corresponding to each pattern region with the semi-light-shielding portion 102 sandwiched therebetween. Furthermore, in this embodiment, the semi-light-shielding portion 102 is also provided around corners of each light-shielding portion 101 (i.e., each pattern region) including its corners disposed on a side of the pattern opposing region 105. The semi-light-shielding portion 102 has a larger width in the periphery of each corner of each light-shielding portion 101 than in the periphery of each light-shielding portion 101 excluding the corners thereof. In other words, a part of the semi-light-shielding portion 102 formed around each corner of each light-shielding portion 101 is provided so as to protrude beyond another part of the semi-light-shielding portion 102 formed in the periphery of each light-shielding portion 101 excluding the corners thereof.

In the photomask of this embodiment having the aforementioned structure, the MEF can be reduced also in the pattern opposing region as well as roundness of corners of a resist pattern to be formed and recess of an end derived from the roundness can be suppressed. Accordingly, in the case where the photomask of this embodiment is applied to formation of, for example, a pattern having a circuit layout in which a plurality of transistors are adjacent to one another, an opposing region between gate layer patterns and an external length of a gate in the opposing region can be reduced, so that transistors can be disposed at a high density for realizing high integration of an LSI. Furthermore, in this embodiment, the semi-light-shielding portion 102 is provided so as to surround the first transparent portion 104A disposed in the pattern opposing region 105. Such a structure is preferable particularly in the case where a space dimension between resist patterns is fine.

Moreover, in this embodiment, the semi-light-shielding portion 102 is disposed so as to surround the periphery of the mask pattern (namely, the periphery of the light-shielding portions 101 corresponding to the respective pattern regions). Owing to such a structure, optical proximity correction (OPC) can be easily performed in mask pattern creation.

It is noted that the light-shielding portion 101 is a part that does not substantially transmit light. However, in practical use, the light-shielding portion 101 may have transmittance of approximately 1% against exposing light, and also in this case, it is assumed that the light-shielding portion 101 is substantially the same as a light-shielding portion with transmittance of 0%. Also, the semi-light-shielding portion 102 is a part partially transmitting light. In other words, the semi-light-shielding portion 102 is a part that transmits light more than the light-shielding portion 101 simultaneously present and does not transmit light more than the transparent portions 104A and 104B simultaneously present. At this point, there is an identical phase relationship (specifically, a relationship with a phase difference not less than (−30+360×n) degrees and not more than (30+360×n) degrees (wherein n is an integer)) between light passing through the semi-light-shielding portion 102 and light passing through the transparent portions 104A and 104B.

Figure 1C:
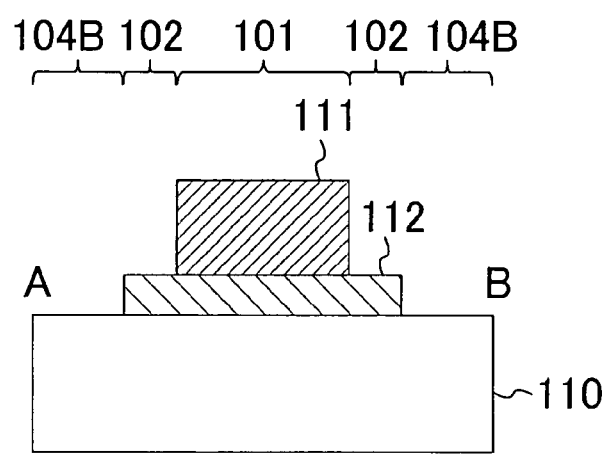

FIG. 1C shows an exemplified cross-sectional structure of the photomask shown in the plan view of FIG. 1B. Specifically, FIG. 1C shows the cross-sectional structure of a portion corresponding to line AB of FIG. 1B. As shown in FIG. 1C, in this embodiment, a quartz substrate 110 is used as an example of the transparent substrate, and the transparent portions 104A and 104B correspond to bare regions of the quartz substrate 110. The semi-light-shielding portion 102 is formed by depositing a metal thin film 112 of, for example, Mo as a semi-light-shielding film on the quartz substrate 110. The material for the metal thin film 112 may be Ta or the like apart from Mo. Specifically, transmittance of approximately 5 through 50% against light of a wavelength of 193 nm can be realized by using a metal thin film 112 with a thickness of approximately 10 through 30 nm. The light-shielding portion 101 is formed by further stacking, for example, a Cr film 111 as a light-shielding film on the metal thin film 112. Specifically, in the case where a Cr film 111 with a thickness of approximately 50 nm is singly deposited on, for example, the quartz substrate 110, a light-shielding portion 101 with transmittance of approximately 1% against the light of the wavelength of 193 nm can be realized, and in the case where a Cr film 111 with a thickness of approximately 100 nm is singly deposited on, for example, the quartz substrate 110, a light-shielding portion 101 with transmittance less than 0.1% against the light of the wavelength of 193 nm can be realized. Accordingly, in the case where the Cr film 111 is deposited on the metal thin film 112 of, for example, Mo as in this embodiment, the light-shielding portion 101 substantially does not transmit the light.

The photomask of this embodiment having the aforementioned structure exhibits good pattern formation characteristics, and specifically, an MEF reducing effect and an effect to suppress roundness of resist pattern corners, in forming a pattern on a wafer, which will now be described with reference to a result of simulation. In the following description, exposure conditions employed in optical calculation in the simulation are an exposure wavelength λ of 193 nm and a numerical aperture NA of 0.85 unless otherwise mentioned. Also, as illumination conditions, ⅔ annular illumination having the outer diameter with a degree of interference of 0.8 and the inner diameter with a degree of interference of 0.53 is used. Furthermore, the transmittance of the semi-light-shielding portion against exposing light is 15%.

FIGS. 2A, 2B, 3A, 3B, 4A and 4B are diagrams for explaining that the photomask of this embodiment can suppress the roundness of resist pattern corners. In FIGS. 2A, 2B, 3A, 3B, 4A and 4B, a pattern opposing region and its periphery are enlarged along a pattern opposing direction.

Figure 2A:
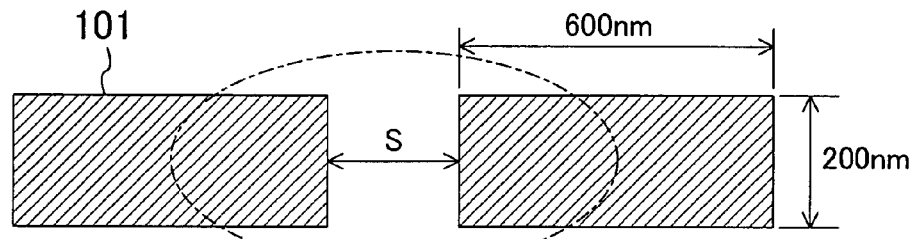
FIG. 2A is a plan view of a photomask of a comparative example including a light-shielding portion alone and FIG. 2B is a diagram for showing a pair of resist patterns formed through exposure of the photomask of FIG. 2A as a result of simulation.

First, FIG. 2A shows the plane structure of a photomask of a comparative example including a light-shielding portion alone. Specifically, in the photomask of FIG. 2A, a pair of rectangular patterns (light-shielding portions 101) opposing and close to each other are provided as a mask pattern. In this case, each rectangular pattern has a size of 600 nm×200 nm, and a distance between the rectangular patterns (namely, an opposing distance), that is, the length of an opposing region along the opposing direction of the rectangular patterns (an opposing length), is a length S. In the photomask of FIG. 2A, the respective rectangular patterns are disposed so that the width of the opposing region along a direction vertical to the opposing direction of the rectangular patterns can be defined by the side of each rectangular pattern with a length of 200 nm. Hereinafter, the photomask shown in FIG. 2A is designated as a photomask "Type 1".

Figure 2B:
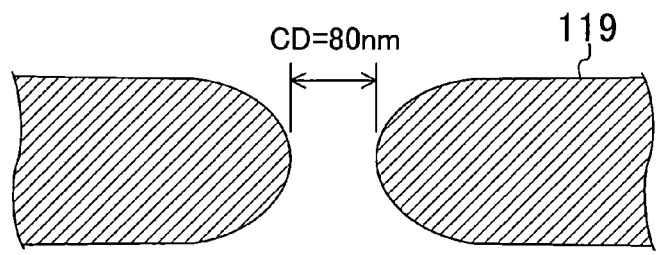

FIG. 2B shows a result of simulation for forming a pair of resist patterns through exposure of the photomask of FIG. 2A for attaining a finished dimension (a CD value) of the opposing distance of 80 nm. As is understood from the simulation result shown in FIG. 2B, a pair of resist patterns 119 formed by using the photomask of FIG. 2A have round corners, and hence, the CD value of the opposing distance of 80 nm can be attained merely between the tips of the rounded line ends. In other words, a pattern width cannot be sufficiently secured in the resist patterns 119 in the vicinity of a part where the CD value of the opposing distance of 80 nm is attained.

Figure 3A:
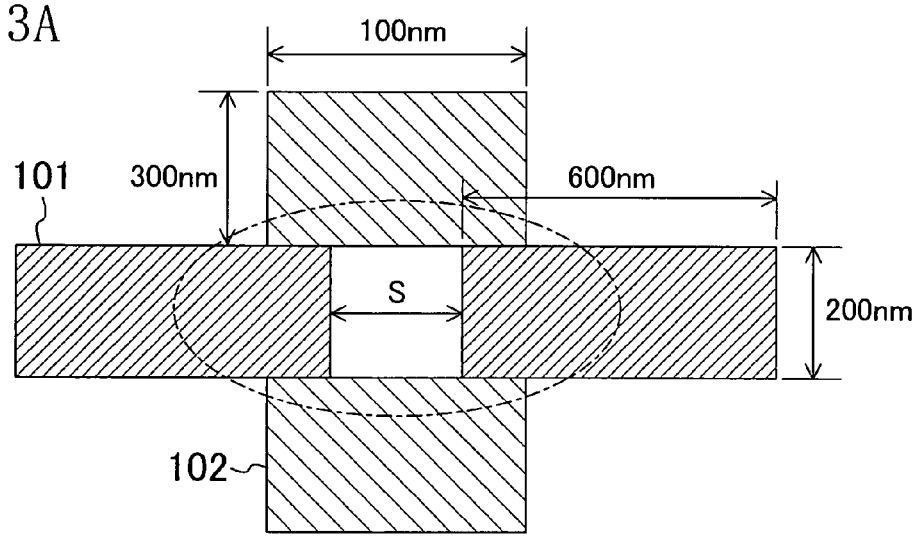
FIG. 3A is a plan view of a photomask further including a semi-light-shielding portion provided around an opposing region between the light-shielding portions of the photomask of FIG. 2A

FIG. 3A shows a plane structure of a photomask obtained by further providing semi-light-shielding portions 102 each with a size of 300 nm×100 nm around the opposing region (specifically, in upper and lower regions of the opposing region) positioned between the rectangular patterns (the light-shielding portions 101) of the photomask of FIG. 2A. In the photomask of FIG. 3A, the semi-light-shielding portions 102 are provided so as to overlap the rectangular patterns. At this point, the width of the overlap between each rectangular pattern (each light-shielding portion 101) and the semi-light-shielding portion 102 is (100 nm−S nm)/2. Hereinafter, the photomask shown in FIG. 3A is designated as a photomask "Type 2".

Figure 3B:
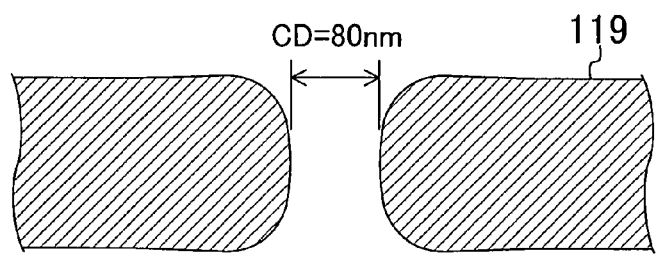
FIG. 3B is a diagram for showing a pair of resist patterns formed through exposure of the photomask of FIG. 3A as a result of simulation.

FIG. 3B shows a result of simulation for forming a pair of resist patterns through exposure of the photomask of FIG. 3A for attaining a finished dimension (a CD value) of the opposing distance of 80 nm. As is understood from the simulation result shown in FIG. 3B, the roundness of corners is suppressed in a pair of resist patterns 119 formed by using the photomask of FIG. 3A. As a result, a pattern width can be sufficiently secured in each resist pattern 119 in the vicinity of a part where the CD value of the opposing distance of 80 nm is attained.

Figure 4A:
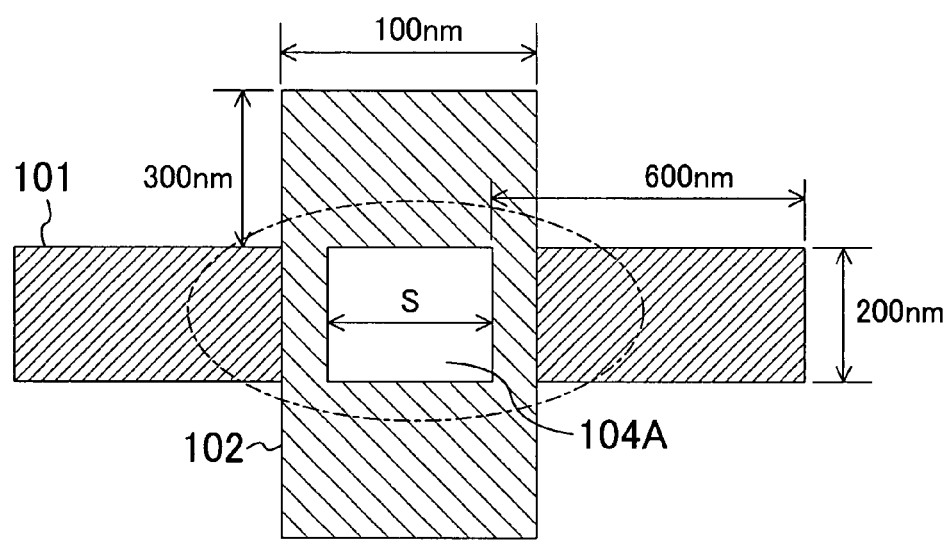
FIG. 4A is a plan view of a photomask further including a semi-light-shielding portion provided between the light-shielding portion and a transparent portion disposed within an opposing region of the photomask of FIG. 3A

FIG. 4A shows a plane structure of a photomask obtained by further providing a semi-light-shielding portion 102 between each rectangular pattern (each light-shielding portion 101) and a first transparent portion 104A disposed within the opposing region of the photomask of FIG. 3A. Hereinafter, the photomask shown in FIG. 4A is designated as a photomask "Type 3". In the photomask "Type 3", a part (in the vicinity of the opposing region) of the rectangular pattern (the light-shielding portion 101) of the photomask of FIG. 3A is replaced with the semi-light-shielding portion 102, and the opposing distance S corresponds to a length, along the opposing direction, of a part of the opposing region excluding the semi-light-shielding portion 102 (i.e., the first transparent portion 104A). In this case, the width of the semi-light-shielding portion 102 sandwiched between each rectangular pattern (each light-shielding portion 101) and the first transparent portion 102A disposed within the opposing region is (100 nm−S nm)/2.

Figure 4B:
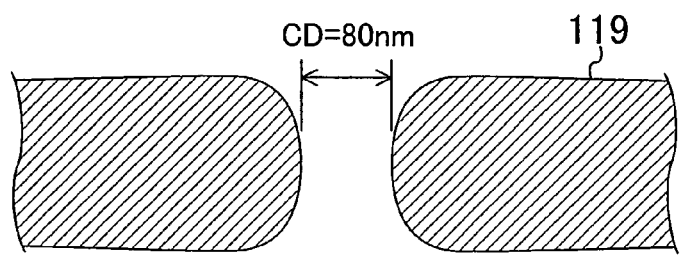
FIG. 4B is a diagram for showing a pair of resist patterns formed through exposure of the photomask of FIG. 4A as a result of simulation.

FIG. 4B shows a result of simulation for forming a pair of resist patterns through exposure of the photomask of FIG. 4A for attaining a finished dimension (a CD value) of the opposing distance of 80 nm. As is understood from the simulation result shown in FIG. 4B, the roundness of corners is suppressed in a pair of resist patterns 119 formed by using the photomask of FIG. 4A in the same manner as in the simulation result of the photomask "Type 2" shown in FIG. 3B. As a result, a pattern width can be sufficiently secured in each resist pattern 119 in the vicinity of a part where the CD value of the opposing distance of 80 nm is attained.

Figure 5A:
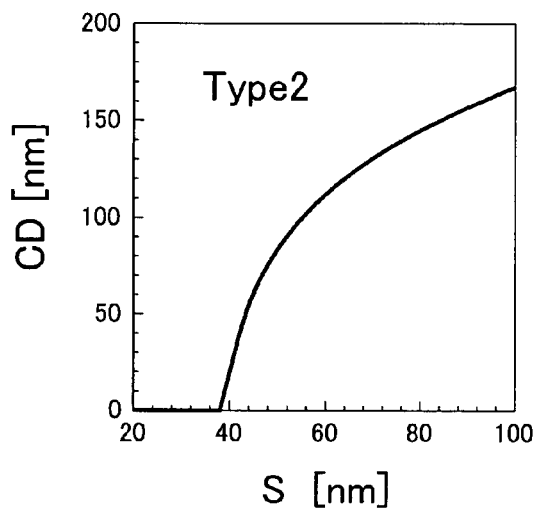
FIG. 5A is a diagram for showing a result of simulation for a CD value of an opposing distance between resist patterns obtained through the exposure of the photomask of FIG. 3A performed while changing a pattern opposing distance S.
Figure 5B:
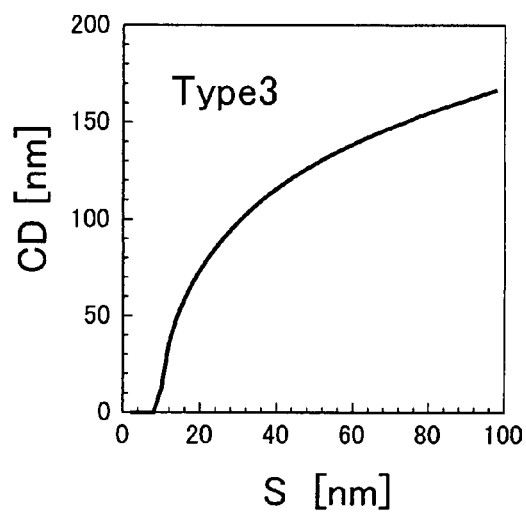
FIG. 5B is a diagram for showing a result of simulation for a CD value of an opposing distance between resist patterns obtained through the exposure of the photomask of FIG. 4A while changing a pattern opposing distance S.
Figure 5C:
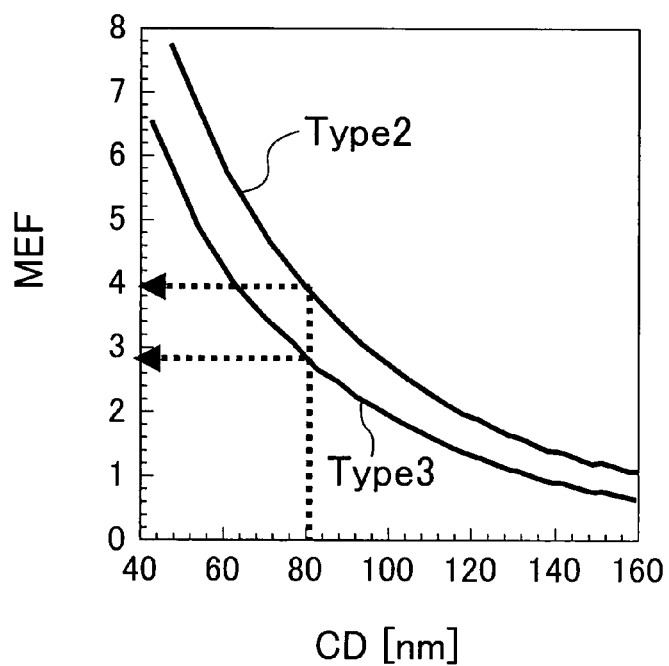
FIG. 5C is a diagram for showing a result of simulation for MEF of a CD value of an opposing distance between resist patterns formed by using each of the photomasks of FIGS. 3A and 4A.

FIGS. 5A through 5C show a result of comparison in MEF of CD values of the opposing distances obtained through the exposure performed by using the photomasks "Type 2" and "Type 3". Specifically, FIG. 5A shows a result of simulation for a CD value of the opposing distance between resist patterns obtained through the exposure using the photomask "Type 2" of FIG. 3A while changing the pattern opposing distance S. FIG. 5B shows a result of simulation for a CD value of the opposing distance between resist patterns obtained through the exposure using the photomask "Type 3" of FIG. 4A while changing the pattern opposing distance S. Furthermore, FIG. 5C shows the MEF of the CD values of the opposing distances between the resist patterns formed by respectively using the photomasks "Type 2" and "Type 3" calculated by substituting the results of FIGS. 5A and 5B in a calculation formula of MEF=ΔCD/ΔS.

In general, either in a resist pattern or in a space pattern, MEF of approximately 1 can be realized when the pattern is larger than λ/NA, and increase of MEF cannot be avoided when the pattern is smaller than λ/NA, and in particular, the increase of MEF is serious when the pattern is not larger than 0.5×λ/NA. This means that means for reducing the MEF is preferably provided when the opposing distance of a mask pattern is λ/NA or less.

As shown in FIG. 5C, in using the photomask "Type 2", a resist pattern can be formed with MEF of approximately 1 when the CD value of the opposing distance is 160 nm, and the MEF is increased to approximately 4 when the CD value of the opposing distance is reduced to 80 nm. When the MEF is approximately 4, variation of the mask dimension of approximately 1 nm varies the resist dimension by as large as 4 nm. Under such a circumstance, it is difficult to stably form a resist pattern. It is noted that the opposing distance S of the mask pattern is 49 nm when the CD value of the opposing distance of 80 nm is attained by the photomask "Type 2".

Furthermore, as shown in FIG. 5C, in using the photomask "Type 3", a resist pattern can be formed with MEF not more than 1 when the CD value of the opposing distance is 160 nm, and the MEF can be suppressed to be not more than 3 even when the CD value of the opposing distance is reduced to 80 nm. In the case where the CD value of the opposing distance of 80 nm is attained by using the photomask "Type 3", the opposing distance S of the mask pattern is 22 nm, and the width (the length along the opposing direction) of the semi-light-shielding portion 102 disposed within the opposing region is 39 nm. Also, it is when the CD value of the opposing distance is reduced to approximately 60 nm that the MEF of the CD value of the opposing distance is increased beyond 4 in using the photomask "Type 3". In this case, the opposing distance S of the mask pattern is 18 nm, and the width (the length along the opposing direction) of the semi-light-shielding portion 102 disposed within the opposing region is 41 nm.

In this manner, the increase of the MEF can be suppressed in realizing a fine CD value by using the photomask "Type 3", namely, the photomask of this embodiment, as compared with the case where the photomask "Type 2" is used. Specifically, in order to stably form a resist pattern with the increase of the MEF suppressed, the CD value of the opposing distance between resist patterns can be reduced to merely approximately 80 nm in using the photomask "Type 2", but the CD value can be reduced to approximately 60 nm in using the photomask "Type 3".

Accordingly, in forming a pattern with an opposing distance smaller than λ/NA (which is 227 nm in the above-described simulation), the MEF of the opposing distance between resist patterns can be improved by employing the structure of the photomask "Type 3", namely, the photomask of this embodiment, and specifically, the structure in which a semi-light-shielding portion is provided between a transparent portion disposed in a pattern opposing region and each pattern region (which is a light-shielding portion in this embodiment). This MEF improving effect is particularly remarkably exhibited in forming a pattern with an opposing distance not more than 0.5×λ/NA. However, a distance not less than 0.02×λ/NA is necessary for making the opposing distance optically significant as an opposing distance between pattern regions separated from each other on a photomask.

Now, the MEF improving effect of this embodiment will be theoretically described. A corner of a resist pattern is rounded because a light-shielding portion is surrounded with a transparent portion at a corner of a corresponding mask pattern and hence light passing through the transparent portion and rounding to the back side of the light-shielding portion becomes excessive, namely, because a light-shielding effect of the corner of the mask pattern is not sufficient.

When a semi-light-shielding portion is provided around corners of a mask pattern disposed on a side of a pattern opposing region as in the photomask "Type 2", an isolated transparent portion is present in the opposing region. Under this circumstance, when the isolated transparent portion is reduced by increasing a light-shielding portion used as the mask pattern, light passing through the transparent portion is largely reduced. This seems to be the reason why the MEF is increased in the pattern opposing region in the photomask "Type 2".

On the other hand, when a transparent portion disposed in a pattern opposing region is surrounded with a semi-light-shielding portion as in the photomask "Type 3", namely, the photomask of this embodiment, and the transparent portion is reduced by increasing the semi-light-shielding portion, reduction of light passing through the pattern opposing region derived from the reduction of the transparent portion can be suppressed. This is because a semi-light-shielding portion also has a characteristic as a transparent portion, and hence, when the transparent portion is reduced by increasing the semi-light-shielding portion, the reduction of the transparent portion can be substantially halved as compared with the case where the transparent portion is reduced by increasing a light-shielding portion. However, it is premised that the amplitude of exposing light is reduced by 50% in passing through the semi-light-shielding portion, namely, the semi-light-shielding portion has transmittance of 25% against the exposing light.

In other words, the MEF improving effect (reducing effect) of this embodiment is higher as the transmittance of the semi-light-shielding portion against the exposing light is higher. Specifically, although the transmittance of the semi-light-shielding portion is 15% in the above-described simulation, in order to attain an effect to allow the exposing light to pass through the semi-light-shielding portion instead of the light-shielding portion (namely, an effect to suppress the substantial reduction of the transparent portion resulting from the use of the semi-light-shielding portion), the transmittance of the semi-light-shielding portion is at least 5% or more and preferably 10% or more.

Furthermore, in order to suppress the roundness of resist pattern corners by using the photomask of this embodiment, the semi-light-shielding portion is required of an effect to shield excessive exposing light. In order to realize such a shielding effect, the transmittance of the semi-light-shielding portion is not more than 30% at most and is preferably 20% or less.

Accordingly, in order to simultaneously attain the MEF reducing effect and the effect to suppress the roundness of resist pattern corners by using the photomask of this embodiment, the transmittance of the semi-light-shielding portion is preferably not less than 5% and not more than 30%, and in order to sufficiently attain the both effects, the transmittance of the semi-light-shielding portion is preferably not less than 10% and not more than 20%.

In the above-described exemplified case, the width, along the direction vertical to the pattern opposing direction, of the transparent portion disposed in the pattern opposing region is the same as the length (200 nm) of the side, extending along the vertical direction, of each rectangular pattern (each of a pair of light-shielding portions), which does not limit the invention.

Figure 6A:
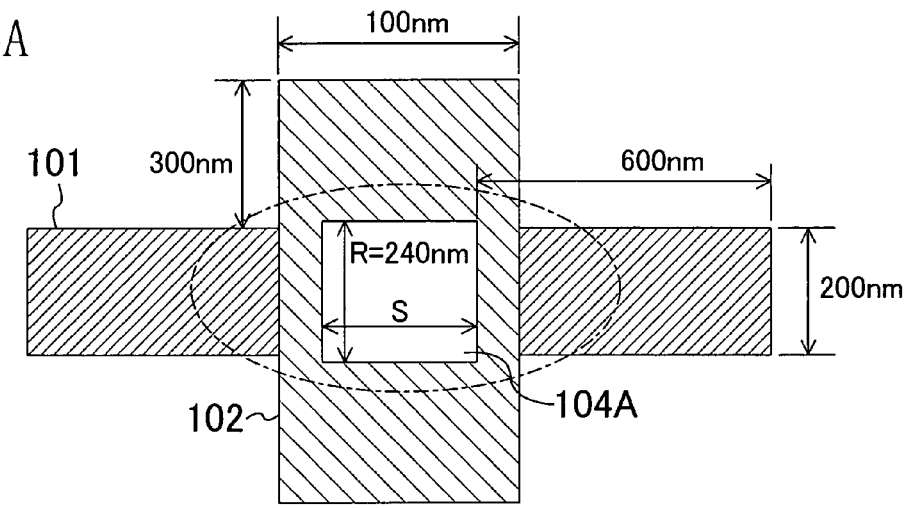
FIGS. 6A and 6B are diagrams for showing variations of a plane structure of the photomask of Embodiment 1 of the invention and FIG. 6C is a diagram for showing a result of simulation for MEF of a CD value of an opposing distance between resist patterns formed by using each of the photomasks of FIGS. 6A and 6B.
Figure 6B:
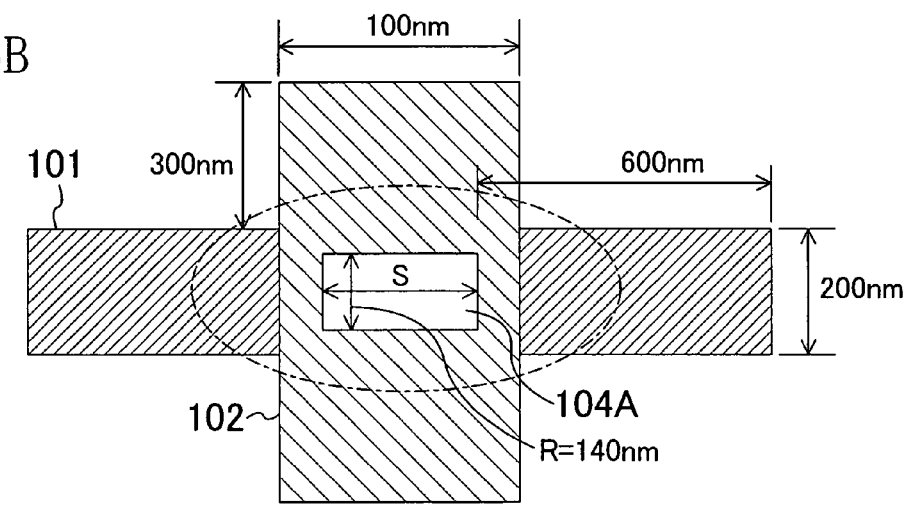

FIGS. 6A and 6B show variations of the plane structure of the photomask "Type 3", namely, the photomask of this embodiment, shown in FIG. 4A. A difference of the photomasks of FIGS. 6A and 6B from the photomask "Type 3" of FIG. 4A is that the width, along the direction vertical to the pattern opposing direction, of the transparent portion disposed in the pattern opposing direction is different from the length of the side, extending along the vertical direction, of each rectangular pattern (each of a pair of light-shielding portions). In FIGS. 6A and 6B, the pattern opposing region and its periphery are enlarged along the pattern opposing direction.

Specifically, in each of the photomask of FIGS. 6A and 6B, a pair of rectangular patterns (light-shielding portions 101) opposing each other at a distance of 100 nm are provided as a mask pattern in the same manner as in the photomask "Type 3" of FIG. 4A. At this point, in a pattern opposing region of the photomask of FIG. 6A, a first transparent portion 104A with a length S along the pattern opposing direction and a width R of 240 nm along the vertical direction to the pattern opposing direction is provided. Also, in a pattern opposing region of the photomask of FIG. 6B, a first transparent portion 104A with a length S along the pattern opposing direction and a width R of 140 nm along the direction vertical to the pattern opposing direction is provided. Moreover, a semi-light-shielding portion 102 is provided in and around the pattern opposing region so as to surround the first transparent portion 104A in each of the photomasks of FIGS. 6A and 6B. It is noted that a part of the semi-light-shielding portion 102 disposed in each of an upper region and a lower region of the pattern opposing region has a size of 300 nm×100 nm.

Figure 6C:
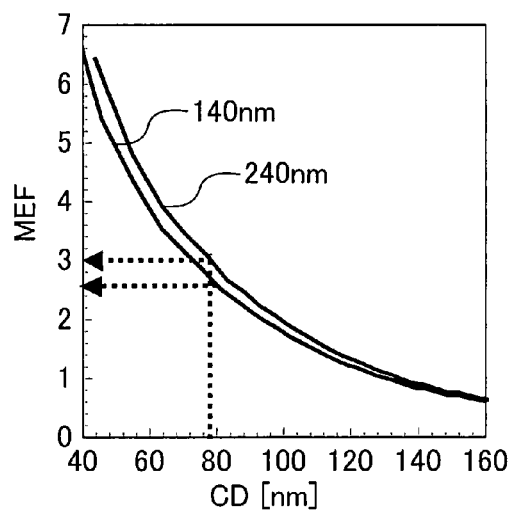

FIG. 6C is a diagram for showing a result of simulation for MEF of a CD value of an opposing distance between resist patterns formed by using each of the photomasks of FIGS. 6A and 6B. As shown in FIG. 6C, in using the photomask of FIG. 6A (including the transparent portion 104A with the width R of 240 nm disposed in the pattern opposing region), the MEF attained when the CD value of the opposing distance is 80 nm is approximately 3, which is equivalent to that of the photomask "Type 3" (the photomask shown in FIG. 4A (including the transparent portion 104A with the width R of 200 nm disposed in the pattern opposing region)). Also, as shown in FIG. 6C, in using the photomask of FIG. 6B (including the transparent portion 104A with the width R of 140 nm disposed in the pattern opposing region), the MEF obtained when the CD value of the opposing distance is 80 nm is approximately 2.5, which is further smaller than that attained by the photomask "Type 3".

As described so far, in order to stably form a resist pattern in this embodiment even when the CD value of the opposing distance between resist patterns is reduced, a transparent portion disposed in a pattern opposing region is surrounded with a semi-light-shielding portion, and the width, along a direction vertical to the pattern opposing direction, of the transparent portion is set to be smaller than the length of the side (namely, an opposing width), extending along the vertical direction, of each rectangular pattern (each light-shielding portion).

Furthermore, since the semi-light-shielding portion disposed in the pattern opposing region is provided so as to surround the periphery of the mask pattern (namely, the periphery of the light-shielding portions corresponding to the respective pattern regions) in this embodiment, the optical proximity correction for adjusting the dimension of a resist pattern including a dimension of a part in the vicinity of the opposing region can be easily performed. Specifically, the dimension of a resist pattern formed in another part apart from the part in the vicinity of the opposing region can be also adjusted by changing the shape of the semi-light-shielding portion. Accordingly, when the semi-light-shielding portion is provided so as to surround the periphery of the mask pattern, there is no need to simultaneously adjust the dimension of the light-shielding portion and the dimension of the semi-light-shielding portion for the correction of the dimension of the resist pattern, and hence, the optical proximity correction can be easily performed.

In the photomask "Type 3" (the photomask of this embodiment) used in the simulation, the dimension (the length), along the pattern opposing direction, of the semi-light-shielding portion provided around the pattern opposing region is set to be the same as the opposing distance between the pattern regions made of the light-shielding portion. However, in order to reduce the MEF in the photomask of this embodiment, the semi-light-shielding portion is merely provided between the transparent portion disposed in the pattern opposing region and each light-shielding portion corresponding to each pattern region, and therefore, the dimension along the pattern opposing direction of the semi-light-shielding portion provided around the pattern opposing region may be longer or shorter than the opposing distance between the pattern regions. However, in order to prevent the roundness of resist pattern corners, the dimension (the width), along the direction vertical to the pattern opposing direction, of the semi-light-shielding portion provided in and around the pattern opposing region is preferably larger than the dimension along the vertical direction (the opposing width) of the pattern region made of the light-shielding portion. In other words, the semi-light-shielding portion is preferably provided not only in the pattern opposing region but also outside (in the periphery of) the pattern opposing region.

Figure 7A:
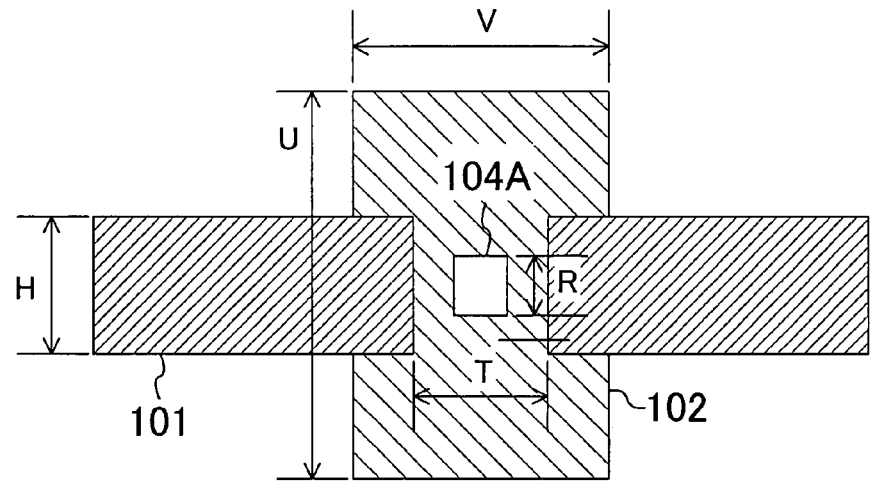
FIGS. 7A, 7B and 7C are diagrams for showing variations of the plane structure of the photomask of Embodiment 1 of the invention.
Figure 7B:
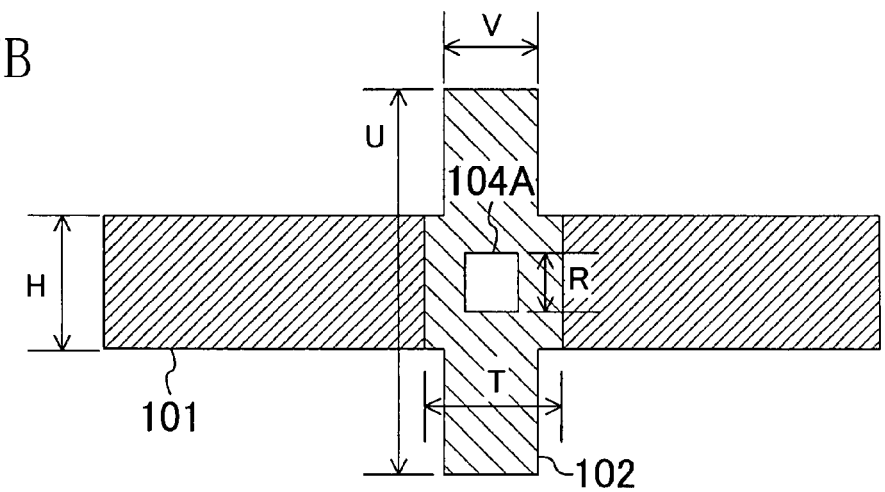
Figure 7C:
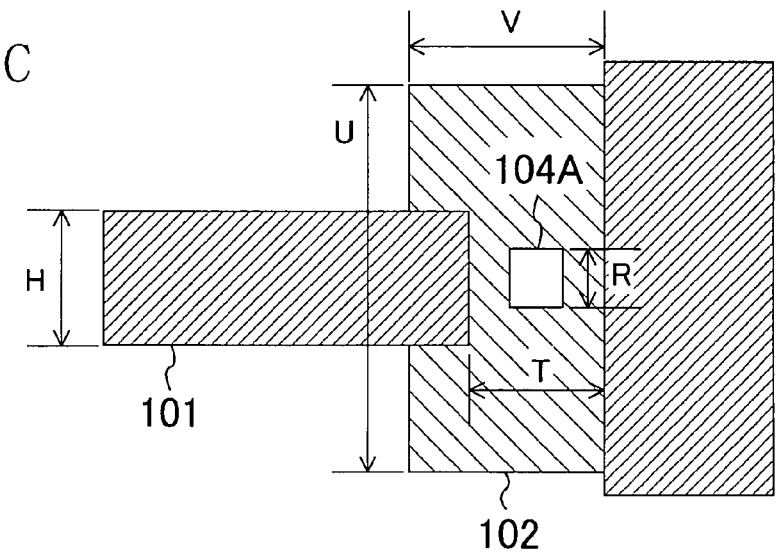

Now, the relationship between the dimension of the pattern opposing region and the dimensions of the outline shapes of the semi-light-shielding portion and the transparent portion will be described with reference to FIGS. 7A through 7C. FIGS. 7A through 7C show variations of the plane structure of the photomask of this embodiment.

In each of the photomasks shown in FIGS. 7A through 7C, a pair of rectangular patterns (light-shielding portions 101) close to each other at an opposing distance T are provided as a mask pattern. In this case, the dimension (the width) of each light-shielding portion 101 along the direction vertical to the pattern opposing direction is indicated by H. However, in the photomask shown in FIG. 7C, the dimension (the width) of each light-shielding portion 101 corresponding to one rectangular pattern along the direction vertical to the pattern opposing direction is set to be larger than the dimension H. Also, in each of the photomasks of FIGS. 7A through 7C, a semi-light-shielding portion 102 is provided in and around the pattern opposing region. At this point, the dimension along the pattern opposing direction of the outline shape of the semi-light-shielding portion 102 is indicated by V, and the dimension thereof along the direction vertical to the pattern opposing direction is indicated by U. However, the dimension V is defined with respect to a part of the semi-light-shielding portion 102 disposed around the pattern opposing region. Also, within the semi-light-shielding portion 102 disposed in the pattern opposing region, a first transparent portion 104A with a dimension R along the direction vertical to the pattern opposing direction is provided.

The dimension V along the pattern opposing direction of the outline shape of the semi-light-shielding portion 102 may be longer than the opposing distance T between the rectangular patterns made of the light-shielding portion 101 as shown in FIG. 7A, or shorter than the opposing distance T as shown in FIG. 7B. In the case where the rectangular patterns (the light-shielding portions 101) opposing and close to each other have different dimensions as shown in FIG. 7C, the opposing width (the width of the pattern opposing region) is defined by the dimension, along the vertical direction, of one rectangular pattern having a shorter dimension along the direction vertical to the pattern opposing direction. Specifically, in each of the photomasks of FIGS. 7A through 7C, the opposing width is indicated by H.

Furthermore, in this embodiment, the dimension R along the direction vertical to the pattern opposing direction of the first transparent portion 104A is preferably smaller than the opposing width H as in each of the photomasks of FIGS. 7A through 7C. However, in order that the first transparent portion 104A is optically significant, the dimension R is preferably not less than $0.02 \times \lambda/NA$. Also, the dimension U along the direction vertical to the pattern opposing direction of the outline shape of the semi-light-shielding portion 102 is preferably larger than the opposing width H. However, when the dimension U is not less than $\lambda/NA$, the effect derived from the semi-light-shielding portion 102 can be sufficiently attained, and hence, when the dimension U is approximately $\lambda/NA$, there is no need to set the dimension U to be larger.

Figure 8A:
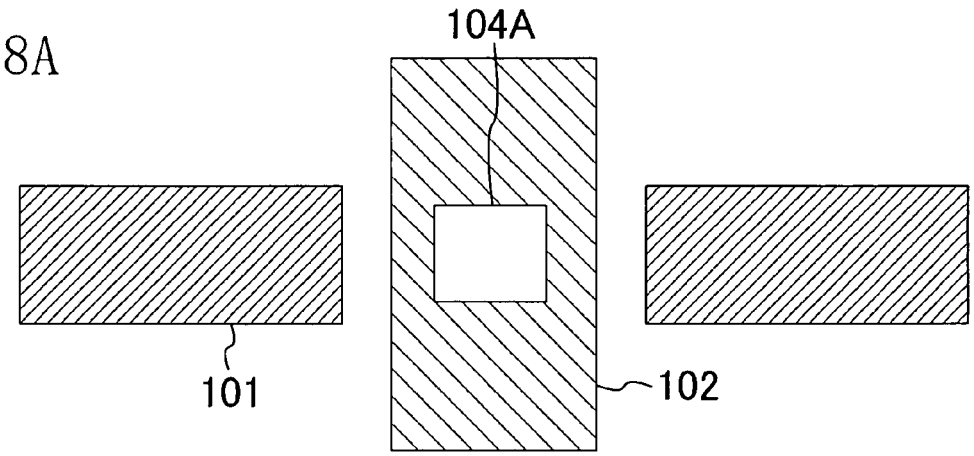
FIGS. 8A, 8B and 8C are diagrams for showing variations of the plane structure of the photomask of Embodiment 1 of the invention.

Moreover, in this embodiment, there is no need for the semi-light-shielding portion 102 disposed in the pattern opposing region to be in contact with the rectangular pattern made of the light-shielding portion 101, and for example, as shown in FIG. 8A, the semi-light-shielding portion 102 and the light-shielding portion 101 may be spaced from each other by providing, between the semi-light-shielding portion 102 and the light-shielding portion 101, a transparent portion with a dimension not affecting an optical image formed by using the photomask. In this case, in the same manner as in the photomask of this embodiment, it is necessary to provide a first transparent portion 104A in a position away from the light-shielding portion 101 with the semi-light-shielding portion 102 sandwiched therebetween. In the mask structure of this embodiment in which the light-shielding film is stacked on the semi-light-shielding film, the mask processing can be easily performed by providing the semi-light-shielding portion 102 in contact with the light-shielding portion 101.

Figure 8B:
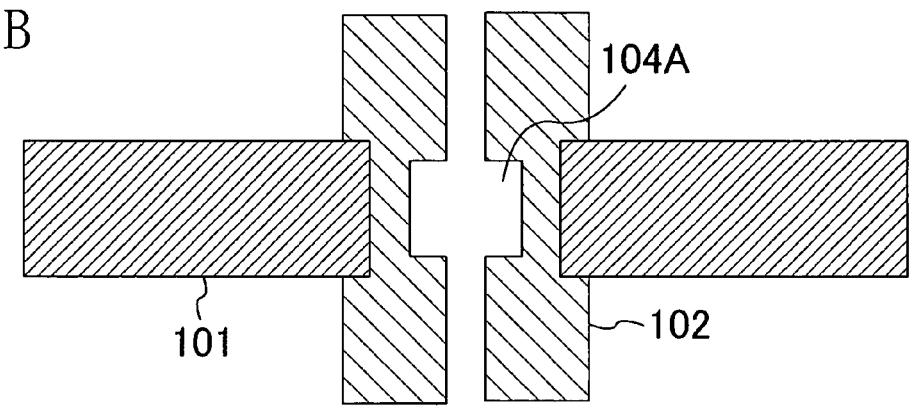

There is no need for the semi-light-shielding portion 102 disposed in the pattern opposing region to completely surround the first transparent portion 104A in this embodiment, and for example, as shown in FIG. 8B, a transparent portion with a dimension not affecting an optical image formed by using the photomask may be provided so as to divide the semi-light-shielding portion 102.

Figure 8C:
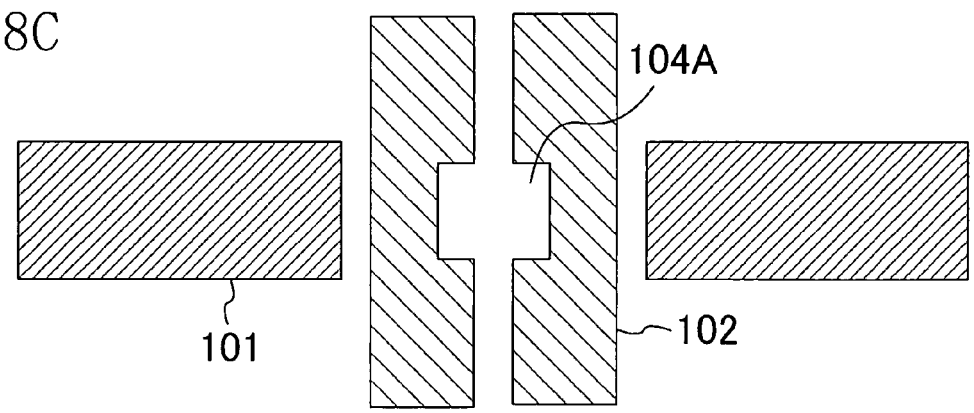

Furthermore, the mask structure of FIG. 8A and the mask structure of FIG. 8B may be combined as shown in a mask structure of FIG. 8C in this embodiment.

Figure 9:
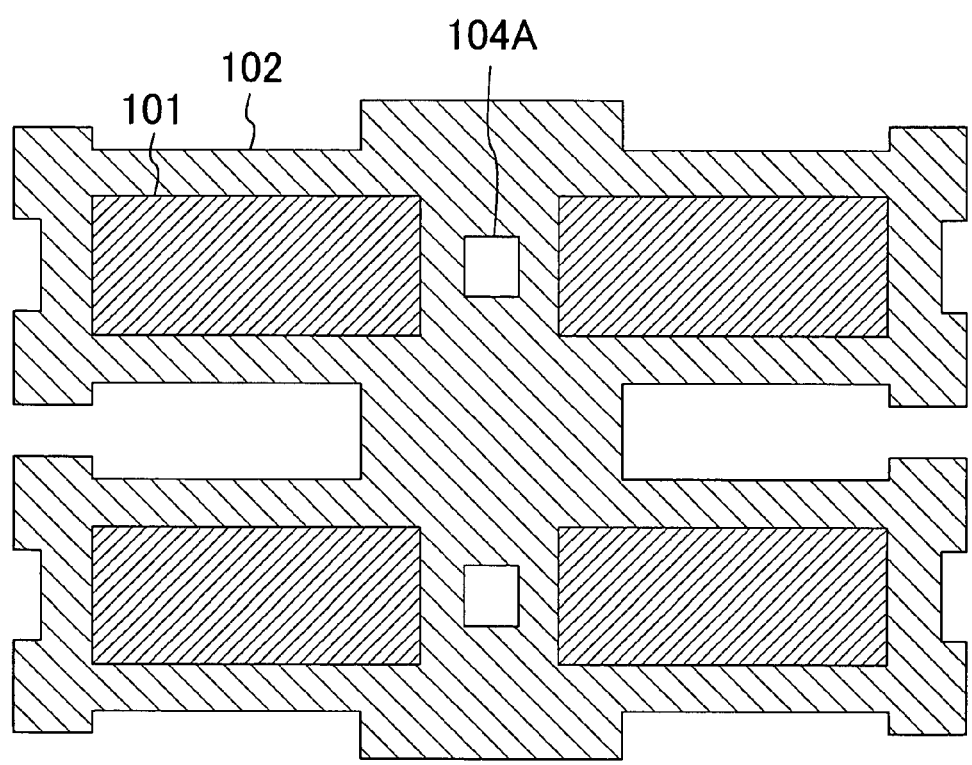
FIG. 9 is a diagram for showing a variation of the plane structure of the photomask of Embodiment 1 of the invention.

Moreover, in the case where the mask pattern of this embodiment, for example, shown in FIG. 1A (that is, a pair of light-shielding portions 101) is arranged in a plurality of lines along the direction vertical to the pattern opposing direction as shown in FIG. 9, in other words, in the case where pattern opposing regions are adjacent to each other along the vertical direction, the semi-light-shielding portions 102 provided around the respective pattern opposing regions may be mutually connected. In other words, the semi-light-shielding portion 102 may be continuously provided for respective mask patterns each including a pair of light-shielding portions 101.

Modification 1 of Embodiment 1

A photomask according to Modification 1 of Embodiment 1 of the invention will now be described with reference to the accompanying drawings.

Figure 10A:
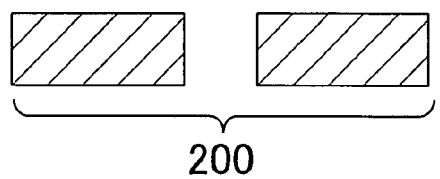
FIG. 10A is a diagram for showing the shape of a desired resist pattern to be formed by using a photomask according to Modification 1 of Embodiment 1 of the invention.
Figure 10B:
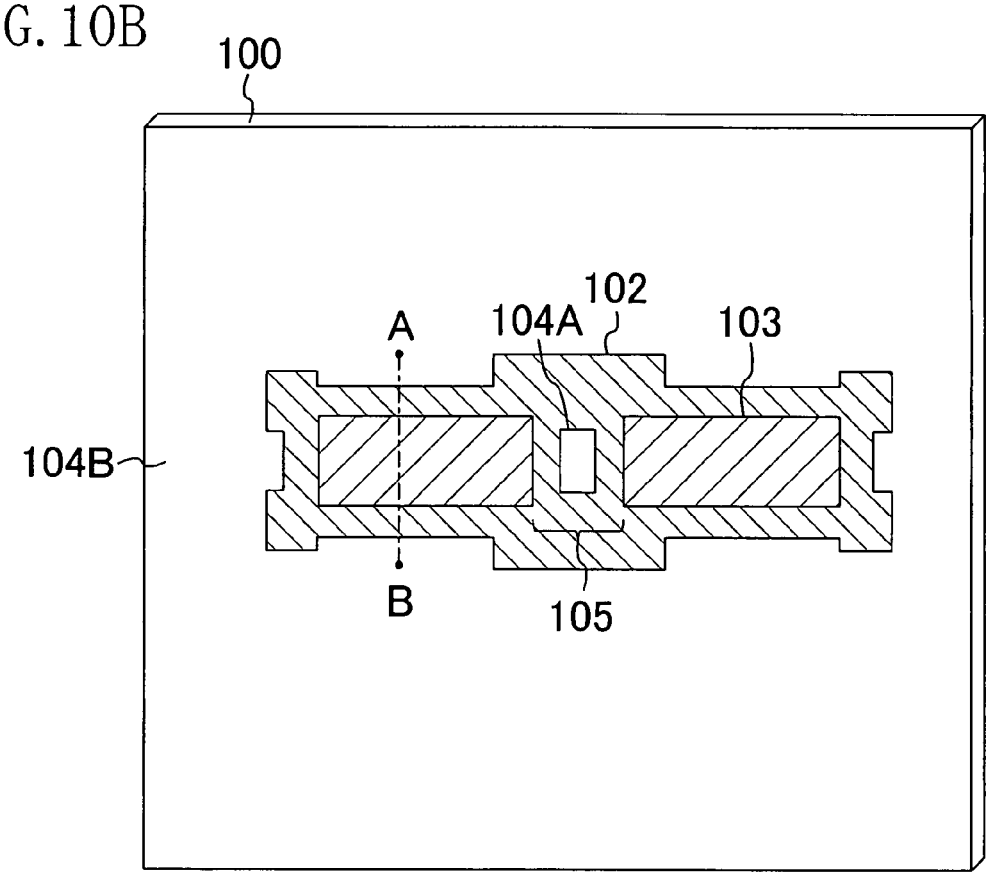
FIG. 10B is a plan view of the photomask of Modification 1 of Embodiment 1 of the invention and FIG. 10C is a cross-sectional view of a portion corresponding to line AB of FIG. 10B.

FIG. 10A is a diagram for showing the shape of a desired resist pattern and FIG. 10B is a plan view of the photomask according to Modification 1 of Embodiment 1. It is noted that a transparent substrate is perspectively shown in FIG. 10B.

As shown in FIG. 10A, the desired pattern is a pair of rectangular resist patterns 200 opposing and close to each other.

As shown in FIG. 10B, a transparent portion 104 (a second transparent portion 104B) is provided over a sufficiently large area on the transparent substrate 100. Also, a mask pattern including a pair of rectangular phase shifter portions 103 opposing and close to each other is provided on the transparent substrate 100 in a position corresponding to the resist patterns (the desired pattern) 200 to be formed on a wafer through exposure. In other words, a difference of this modification from Embodiment 1 is that the mask pattern includes the phase shifter portion 103 instead of a light-shielding portion. The mask pattern corresponding to the resist patterns 200 includes a pair of pattern regions (a pair of phase shifter portions 103) opposing and close to each other also in this modification as in Embodiment 1. As a characteristic of this modification, a semi-light-shielding portion 102 is provided between a first transparent portion 104A disposed in a region 105 sandwiched between the pair of pattern regions (a pattern opposing region) and each of the pattern regions (namely, each of the phase shifter portions 103). In other words, in the opposing region 105, the first transparent portion 104A is provided in a position away from each of the phase shifter portions 103 corresponding to the pattern regions with the semi-light-shielding portion 102 sandwiched therebetween. In this modification, the semi-light-shielding portion 102 is also provided around corners of each phase shifter portion 103 (i.e., each pattern region) including its corners disposed on a side of the pattern opposing region 105.

In the structure of the photomask of this modification described above, also in the case where a phase shifter portion is used as a mask pattern instead of a light-shielding portion, the MEF can be reduced in the pattern opposing region, and the roundness of corners of a resist pattern to be formed and the recess of an end derived from the roundness can be suppressed. Accordingly, in the case where the photomask of this modification is applied to the formation of a pattern having a circuit layout including a plurality of transistors adjacent to one another, the opposing region between gate layer patterns and the external length of a gate in the opposing region can be reduced, so that transistors can be disposed at a high density for realizing high integration of an LSI.

Furthermore, the semi-light-shielding portion 102 is provided so as to surround the first transparent portion 104A disposed in the pattern opposing region 105 in this modification as in Embodiment 1. Such a structure is preferred particularly when a space dimension between resist patterns is fine.

Moreover, the semi-light-shielding portion 102 is provided so as to surround the periphery of the mask pattern (namely, the periphery of the phase shifter portions 103 corresponding to the respective pattern regions) in this modification as in Embodiment 1. When such a structure is employed, the optical proximity correction (OPC) can be easily performed in mask pattern creation.

It is noted that the semi-light-shielding portion 102 is defined in this modification in the same manner as in Embodiment 1. Also, the phase shifter portion 103 transmits light, and there is an opposite phase relationship (specifically, a relationship with a phase difference not less than (150+360×n) degrees and not more than (210+360×n) degrees (wherein n is an integer)) between light passing through the phase shifter portion 103 and light passing through the transparent portions 104A and 104B. However, in this modification, the phase shifter portion 103 used instead of a light-shielding portion is assumed to be a phase shifter portion with low transmittance. In general, when a phase shifter portion is used as a mask pattern instead of a light-shielding portion, the resolution of a fine pattern is improved. It is noted that a phase shifter portion with low transmittance means a phase shifter portion by which a resist is not exposed in a part corresponding to the center of the phase shifter portion even when the phase shifter portion has a large width, and specific transmittance thereof is lower than 15% at most and is preferably not more than 9%.

Figure 10C:
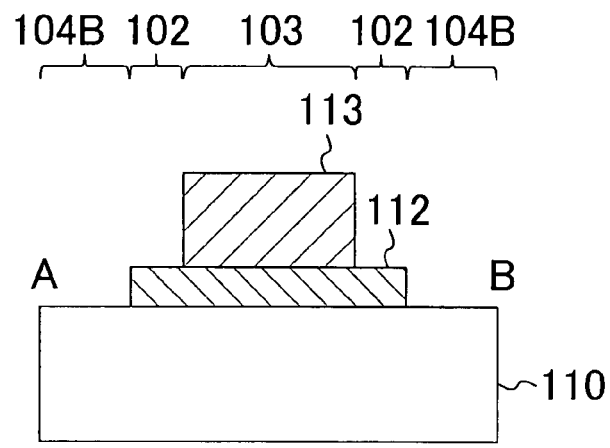

FIG. 10C shows an exemplified cross-sectional structure of the photomask shown in the plan view of FIG. 10B. Specifically, FIG. 10C shows a cross-sectional structure of a portion corresponding to line AB of FIG. 10B. As shown in FIG. 10C, in this modification, a quartz substrate 110 is used as an example of the transparent substrate, and the transparent portions 104A and 104B correspond to bare regions of the quartz substrate 110. The semi-light-shielding portion 102 is formed by stacking a metal thin film 112 of, for example, Mo as a semi-light-shielding film on the quartz substrate 110. The material for the metal thin film 112 may be Ta or the like apart from Mo. Specifically, transmittance of approximately 5 through 50% against light of a wavelength of 193 nm can be realized by using a metal thin film 112 with a thickness of approximately 10 through 30 rn. The phase shifter portion 103 is formed by further stacking, on the metal thin film 112, a film for transmitting exposing light, such as a $SiO_2$ film 113, in a thickness for inverting the phase of the exposing light (that is, approximately 180 nm with respect to a $SiO_2$ film).

The photomask of this modification having the aforementioned structure exhibits good pattern formation characteristics, and specifically, the MEF reducing effect and the effect to suppress the roundness of resist pattern corners, in forming a pattern on a wafer in the same manner as in Embodiment 1, which will now be described on the basis of a result of simulation. Exposure conditions employed in the optical calculation in the simulation are an exposure wavelength λ of 193 nm and a numerical aperture NA of 0.85. Also, as the illumination conditions, ⅔ annular illumination having the outer diameter with a degree of interference of 0.8 and the inner diameter with a degree of interference of 0.53 is used. Furthermore, the transmittance of a semi-light-shielding portion against exposing light is 15%, and the transmittance of a phase shifter portion against the exposing light is 6%.

In the case where a phase shifter portion is used as a mask pattern with a sufficiently large width (specifically, a width larger than λ/NA), the transmittance of the phase shifter against exposing light is preferably lower than 9%. In a mask structure in which a phase shifting film for inverting the phase of exposing light is stacked on a semi-light-shielding film as in this modification, a phase shifter portion having lower transmittance than a semi-light-shielding portion can be easily formed, and hence, a phase shifter portion with transmittance lower than 9% can be easily formed. However, in order to attain a significant effect as a phase shifter portion used as a mask pattern, the transmittance of the phase shifter portion against the exposing light is preferably at least 3% or more.

Figure 11A:
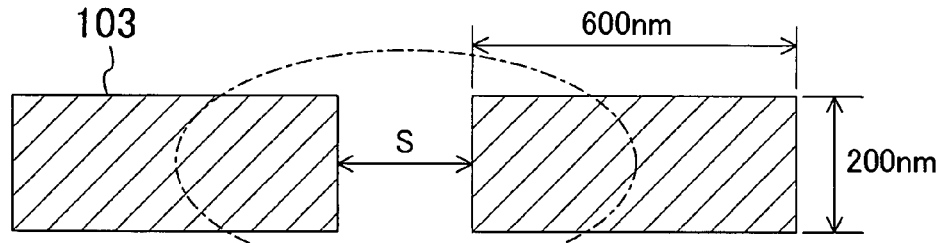
FIG. 11A is a plan view of a photomask of a comparative example including a phase shifter portion alone and FIG. 11B is a diagram for showing a pair of resist patterns formed through exposure of the photomask of FIG. 11A as a result of simulation.

FIGS. 11A, 11B, 12A, 12B, 13A and 13B are diagrams for explaining that the roundness of resist pattern corners can be suppressed by using the photomask of this modification. In FIGS. 11A, 11B, 12A, 12B, 13A and 13B, a pattern opposing region and its periphery are enlarged along the pattern opposing direction. First, FIG. 11A shows the plane structure of a photomask of a comparative example including a phase shifter portion alone. Specifically, in the photomask of FIG. 11A, a pair of rectangular patterns (phase shifter portions 103) opposing and close to each other are provided as a mask pattern. In this case, each rectangular pattern has a size of 600 nm×200 nm, and a distance between the rectangular patterns (namely, an opposing distance), that is, the length of an opposing region along the opposing direction of the rectangular patterns (an opposing length), is a length S. In the photomask of FIG. 1A, the respective rectangular patterns are arranged so that the width (an opposing width) of the opposing region along a direction vertical to the opposing direction of the rectangular patterns can be defined by the side of each rectangular pattern with a length of 200 nm. In other words, the photomask of FIG. 11A has a structure obtained by replacing the light-shielding portion 101 of the photomask of FIG. 2A with the phase shifter portion 103, and has a similar structure to the photomask of FIG. 2A apart from this replacement. Hereinafter, the photomask shown in FIG. 11A is designated as a photomask "Type 1".

Figure 11B:
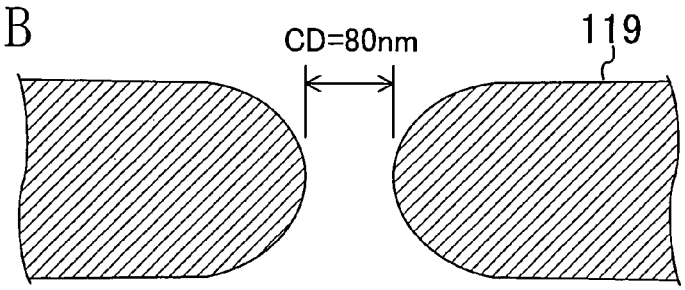

FIG. 11B shows a result of simulation for forming a pair of resist patterns through exposure of the photomask of FIG. 11A for attaining a finished dimension (a CD value) of the opposing distance of 80 nm. As is understood from the simulation result shown in FIG. 11B, a pair of resist patterns 119 formed by using the photomask of FIG. 11A have round corners, and hence, the CD value of the opposing distance of 80 nm can be attained merely between the tips of the rounded line ends. In other words, a pattern width cannot be sufficiently secured in the resist patterns 119 in the vicinity of a part where the CD value of the opposing distance of 80 nm is attained.

Figure 12A:
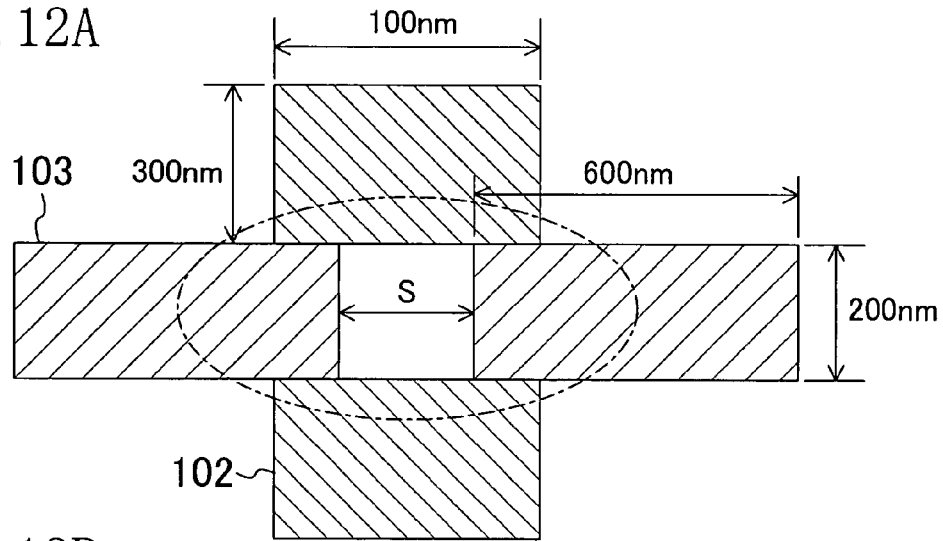
FIG. 12A is a plan view of a photomask further including a semi-light-shielding portion provided in an opposing region between phase shifter portions of the photomask of FIG. 11A

FIG. 12A shows a plane structure of a photomask obtained by further providing semi-light-shielding portions 102 each with a size of 300 nm×100 nm around the opposing region (specifically, in upper and lower regions of the opposing region) positioned between the rectangular patterns (the phase shifter portions 103) of the photomask of FIG. 11A. In the photomask of FIG. 12A, the semi-light-shielding portions 102 are provided so as to overlap the rectangular patterns. At this point, the width of the overlap between each rectangular pattern (each phase shifter portion 103) and the semi-light-shielding portion 102 is (100 nm−S nm)/2. In other words, the photomask of FIG. 12A has a structure obtained by replacing the light-shielding portion 101 of the photomask of FIG. 3A with the phase shifter portion 103, and has a similar structure to the photomask of FIG. 3A apart from this replacement. Hereinafter, the photomask shown in FIG. 12A is designated as a photomask "Type 2".

Figure 12B:
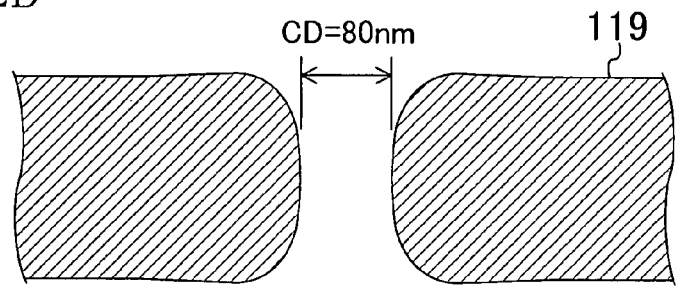
FIG. 12B is a diagram for showing a pair of resist patterns formed through exposure of the photomask of FIG. 12A as a result of simulation.

FIG. 12B shows a result of simulation for forming a pair of resist patterns through exposure of the photomask of FIG. 12A for attaining a finished dimension (a CD value) of the opposing distance of 80 nm. As is understood from the simulation result shown in FIG. 12B, the roundness of corners is suppressed in a pair of resist patterns 119 formed by using the photomask of FIG. 12A. As a result, a pattern width can be sufficiently secured in each resist pattern 119 in the vicinity of a part where the CD value of the opposing distance of 80 nm is attained.

Figure 13A:
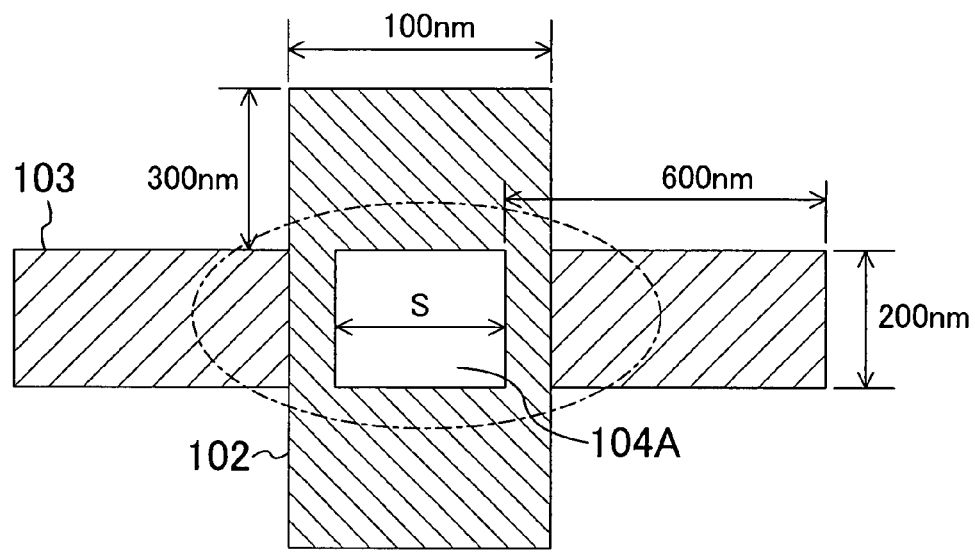
FIG. 13A is a plan view of a photomask further including a semi-light-shielding portion provided between the phase shifter portion and a transparent portion disposed within the opposing region of the photomask of FIG. 12A

FIG. 13A shows the plane structure of a photomask obtained by further providing a semi-light-shielding portion 102 between each rectangular pattern (each phase shifter portion 103) and a first transparent portion 104A disposed within the opposing region of the photomask of FIG. 12A. In other words, the photomask of FIG. 13A has a structure obtained by replacing the light-shielding portion 101 of the photomask of FIG. 4A with the phase shifter portion 103, and has a similar structure to the photomask of FIG. 4A apart from this replacement. Hereinafter, the photomask shown in FIG. 13A is designated as a photomask "Type 3". In the photomask "Type 3", a part (in the vicinity of the opposing region) of the rectangular pattern (the phase shifter portion 103) of the photomask of FIG. 12A is replaced with the semi-light-shielding portion 102, and the opposing distance S corresponds to a length along the opposing direction of a part of the opposing region excluding the semi-light-shielding portion 102 (i.e., the first transparent portion 104A). In this case, the width of the semi-light-shielding portion 102 sandwiched between each rectangular pattern (each phase shifter portion 103) and the first transparent portion 102A disposed within the opposing region is (100 nm−S nm)/2.

Figure 13B:
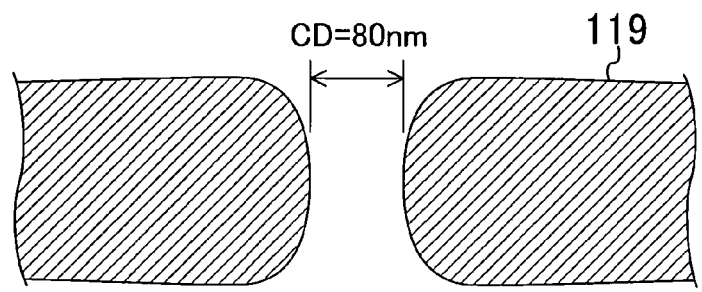
FIG. 13B is a diagram for showing a pair of resist patterns formed through exposure of the photomask of FIG. 13A as a result of simulation.

FIG. 13B shows a result of simulation for forming a pair of resist patterns through exposure of the photomask of FIG. 13A for attaining a finished dimension (a CD value) of the opposing distance of 80 nm. As is understood from the simulation result shown in FIG. 13B, the roundness of corners is suppressed in a pair of resist patterns 119 formed by using the photomask of FIG. 13A, namely, the photomask of this modification, in the same manner as in the simulation result of the photomask "Type 2" shown in FIG. 12B. As a result, a pattern width can be sufficiently secured in each resist pattern 119 in the vicinity of a part where the CD value of the opposing distance of 80 nm is attained.

Figure 14:
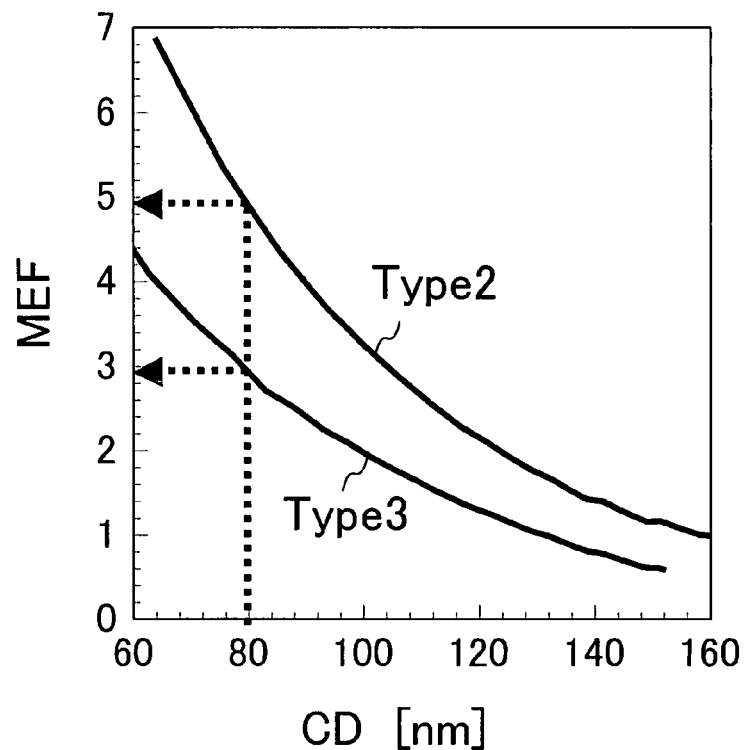
FIG. 14 is a diagram for showing a result of simulation for MEF of a CD value of an opposing distance between resist patterns formed by using each of the photomasks of FIGS. 12A and 13A.

FIG. 14 is a diagram for showing a result of simulation for MEF of a CD value of an opposing distance between resist patterns formed through the exposure using each of the photomasks "Type 2" and "Type 3". As shown in FIG. 14, in using the photomask "Type 2", a resist pattern can be formed with MEF of approximately 1 when the CD value of the opposing distance is 160 nm, and the MEF is increased to approximately 5 when the CD value of the opposing distance is reduced to 80 nm. Therefore, the MEF is further degraded as compared with the case where a light-shielding portion is used as a mask pattern (see FIG. 5A). It is noted that the opposing distance S of the mask pattern for attaining the CD value of the opposing distance of 80 nm by using the photomask "Type 2" is 68 nm.

In general, use of a phase shifter portion as a mask pattern is advantageous in forming a fine line pattern, but according to the result obtained by the photomask "Type 2" shown in FIG. 14, it is understood that the use of a phase shifter portion as a mask pattern is disadvantageous in reducing a pattern opposing region on the contrary.

Furthermore, as shown in FIG. 14, in using the photomask "Type 3", a resist pattern can be formed with MEF not more than 1 when the CD value of the opposing distance is 160 nm, and the MEF can be suppressed to approximately 3 when the CD value of the opposing distance is reduced to 80 nm. In other words, the MEF obtained when the CD value of the opposing distance is reduced to 80 nm can be suppressed to the same extent as the case where a light-shielding portion is used as a mask pattern (see FIG. 5A). In the case where the CD value of the opposing distance of 80 nm is attained by using the photomask "Type 3", the opposing distance S of the mask pattern is 42 nm, and the width (the length along the opposing direction) of the semi-light-shielding portion 102 provided in the opposing region is 29 nm. Furthermore, it is when the CD value of the opposing distance is reduced to approximately 64 nm that the MEF of the CD value of the opposing distance is increased beyond 4 by using the photomask "Type 3". In this case, the opposing distance S of the mask pattern is 36 nm, and the width (the length along the opposing direction) of the semi-light-shielding portion 102 provided in the opposing region is 32 nm.

In this manner, the increase of the MEF can be suppressed in realizing a fine CD value by using the photomask "Type 3", namely, the photomask of this modification, as compared with the case where the photomask "Type 2" is used. Specifically, in order to stably form a resist pattern with the increase of the MEF suppressed, the CD value of the opposing distance between the resist patterns can be reduced to merely approximately 80 nm in using the photomask "Type 2", but the CD value can be reduced to approximately 60 nm in using the photomask "Type 3".

Accordingly, in forming a pattern with an opposing distance smaller than $\lambda/NA$ (which is 227 nm in the above-described simulation), the MEF of the opposing distance between resist patterns can be improved by employing the structure of the photomask "Type 3", namely, the photomask of this modification, and specifically, the structure in which a semi-light-shielding portion is provided between a transparent portion disposed in a pattern opposing region and each pattern region (which is a phase shifter portion in this modification). This MEF improving effect is remarkably exhibited particularly in forming a pattern with an opposing distance not more than $0.5 \times \lambda/NA$. However, a distance not less than $0.02 \times \lambda/NA$ is necessary for making the opposing distance optically significant as an opposing distance between pattern regions separated from each other on a photomask.

Now, the MEF improving effect of this modification will be theoretically described. A corner of a resist pattern is rounded because a phase shifter portion is surrounded with a transparent portion at a corner of a corresponding mask pattern and hence light passing through the transparent portion and rounding to the back side of the phase shifter portion becomes excessive, namely, because a light-shielding effect of the corner of the mask pattern is not sufficient.

When a semi-light-shielding portion is provided around corners of a mask pattern on a side of a pattern opposing region as in the photomask "Type 2", an isolated transparent portion is present in the opposing region. Under this circumstance, when the isolated transparent portion is reduced by increasing a phase shifter portion used as the mask pattern, light passing through the transparent portion is largely reduced. At this point, the phase shifter portion has a characteristic for partially shielding light as well as a function to cancel light passing through the transparent portion. Therefore, as compared with the case where a light-shielding portion is used as a mask pattern, light passing through a transparent portion of the same size is further largely reduced. This seems to be the reason why the MEF is increased in the pattern opposing region of the photomask "Type 2".

On the other hand, when a semi-light-shielding portion is provided between a transparent portion disposed in a pattern opposing region and a phase shifter portion corresponding to a mask pattern as in the photomask "Type 3", namely, the photomask of this modification, even if the mask pattern is made of the phase shifter portion, the transparent portion can be reduced by increasing the semi-light-shielding portion in the same manner as in Embodiment 1. Therefore, reduction of light passing through the pattern opposing region derived from the reduction of the transparent portion can be suppressed.

In other words, the MEF improving effect (reducing effect) of this modification is remarkably exhibited particularly when the mask pattern includes a phase shifter portion.

In order to simultaneously attain the MEF reducing effect and the effect to suppress the roundness of resist pattern corners by using the photomask of this modification, the transmittance of the semi-light-shielding portion is preferably not less than 5% and not more than 30% in the same manner as in Embodiment 1, and in particular, in order to sufficiently attain both the effects, the transmittance of the semi-light-shielding portion is preferably not less than 10% and not more than 20%.

Furthermore, in order to stably form a resist pattern even when the CD value of the opposing distance between resist patterns is reduced in this modification, a transparent portion disposed in a pattern opposing region is surrounded with a semi-light-shielding portion and the width, along the direction vertical to the pattern opposing direction, of the transparent portion is set to be smaller than the length of a side extending along the vertical direction (i.e., the opposing width) of each rectangular pattern (each phase shifter portion) in the same manner as in Embodiment 1.

Furthermore, since the semi-light-shielding portion disposed in the pattern opposing region is provided so as to surround the periphery of the mask pattern (i.e., the periphery of the respective phase shifter portions corresponding to the pattern regions) also in this modification as in Embodiment 1, the optical proximity correction for adjusting the dimensions of the resist pattern including the dimension of a part in the vicinity of the opposing region can be easily performed.

The dimension along the pattern opposing direction of the semi-light-shielding portion disposed around the pattern opposing region may be longer or shorter than the opposing distance between the pattern regions also in this modification as in Embodiment 1. However, in the same manner as in Embodiment 1, for preventing the roundness of resist pattern corners, the dimension (the width), along the direction vertical to the pattern opposing direction, of the semi-light-shielding portion disposed in and around the pattern opposing region is preferably larger than the dimension (the opposing width) along the vertical direction of the pattern region made of a phase shifter portion (namely, the semi-light-shielding portion is preferably disposed not only in the pattern opposing region but also outside (in the periphery) of the opposing region).

Moreover, in this modification, the semi-light-shielding portion 102 provided in the pattern opposing region need not be in contact with the rectangular pattern made of the phase shifter portion 103, but the semi-light-shielding portion 102 and the phase shifter portion 103 may be spaced from each other by providing, between the semi-light-shielding portion 102 and the phase shifter portion 103, a transparent portion with a dimension not affecting an optical image formed by using the photomask.

Furthermore, the semi-light-shielding portion 102 provided in the pattern opposing region need not completely surround the first transparent portion 104A, but a transparent portion with a dimension not affecting an optical image formed by using the photomask may be disposed so as to divide the semi-light-shielding portion 102.

Moreover, in the case where the mask pattern of this modification shown in FIG. 10A (that is, a pair of phase shifter portions 103) is arranged in a plurality of lines along the direction vertical to the pattern opposing direction, in other words, in the case where pattern opposing regions are adjacent to each other along the vertical direction, the semi-light-shielding portions 102 provided around the respective pattern opposing regions may be mutually connected. In other words, the semi-light-shielding portion 102 may be continuously provided for respective mask patterns each including a pair of phase shifter portions 103.

Although the transmittance of the semi-light-shielding portion is set to 15% in the above-described simulation, in order to attain an effect to allow the exposing light to pass through the semi-light-shielding portion instead of the light-shielding portion (namely, an effect to suppress the substantial reduction of the transparent portion resulting from the use of the semi-light-shielding portion), the transmittance of the semi-light-shielding portion is not less than at least 5% and preferably not less than 10% in the same manner as in Embodiment 1. Furthermore, in order to suppress the roundness of resist pattern corners by using the photomask of this modification, the semi-light-shielding portion is required of an effect to shield excessive exposing light. For this purpose, the transmittance of the semi-light-shielding portion is not more than 30% at most and is preferably not more than 20% as in Embodiment 1.

Figure 15:
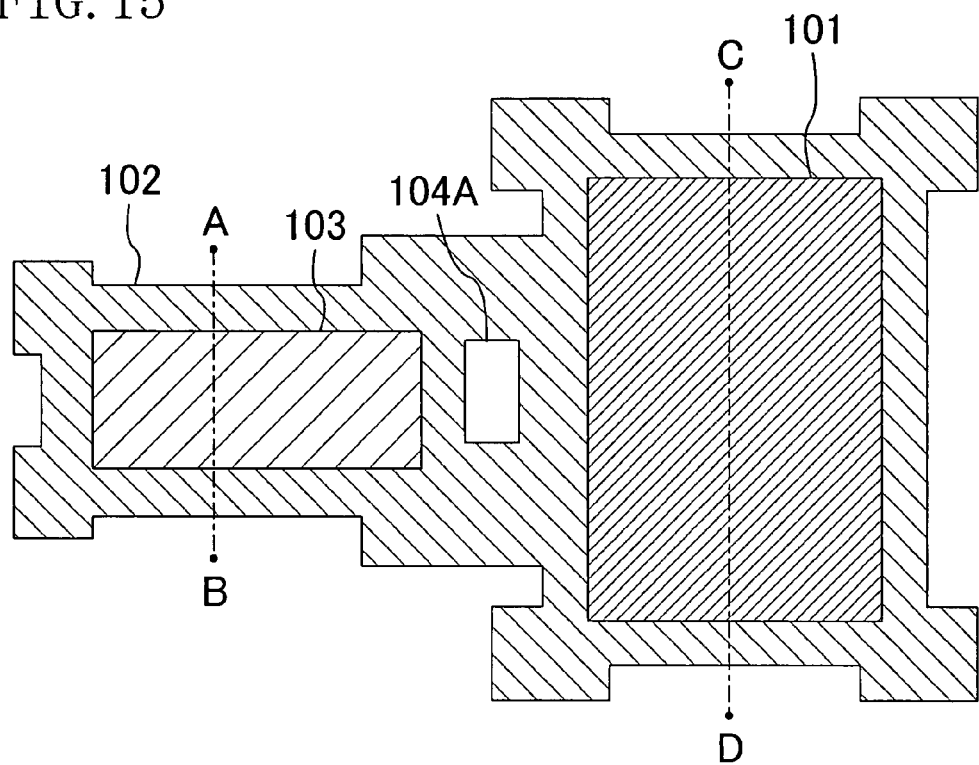
FIG. 15 is a diagram for showing a variation of a plane structure of the photomask according to Modification 1 of Embodiment 1 of the invention.

In the photomask of this modification described so far, a pair of pattern regions opposing each other are both phase shifter portions. Instead, for example, one of the pair of opposing pattern regions may be a phase shifter portion 103 and the other may be a light-shielding portion 101 as shown in FIG. 15. In the photomask shown in FIG. 15, a semi-light-shielding portion 102 is provided between a first transparent portion 104A disposed in a pattern opposing region and each pattern region (namely, each of the phase shifter portion 103 and the light-shielding portion 101). In other words, in the pattern opposing region, the first transparent portion 104A is provided in a position away from each of the phase shifter portion 103 and the light-shielding portion 101 corresponding to the pattern regions with the semi-light-shielding portion 102 sandwiched therebetween. Also, the semi-light-shielding portion 102 is provided also around corners of the phase shifter portion 103 and the light-shielding portion 101 including their corners disposed on a side of the pattern opposing region.

Figure 16A:
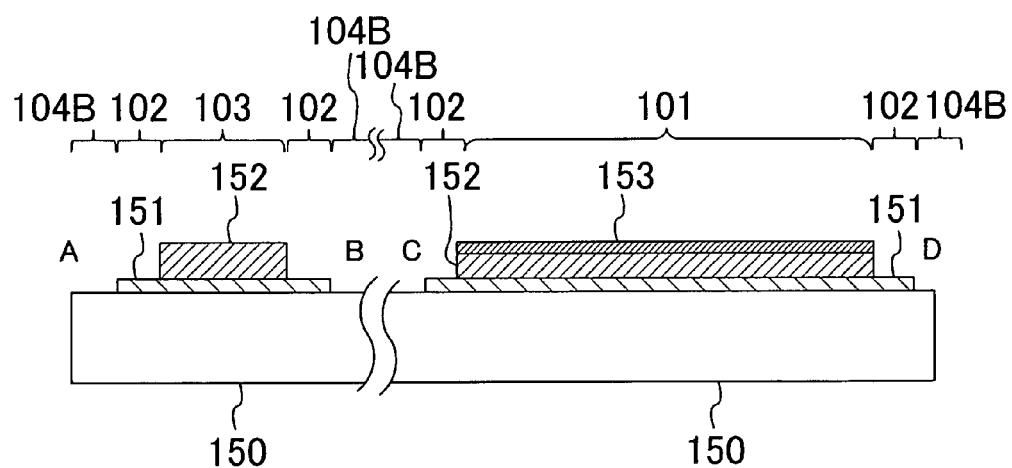
FIGS. 16A and 16B are cross-sectional views of portions corresponding to lines AB and CD of FIG. 15.
Figure 16B:
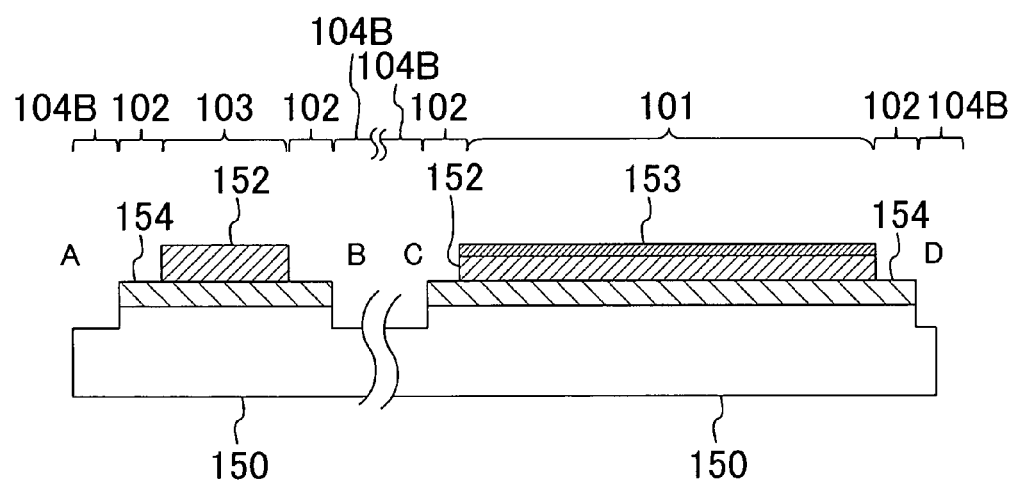

FIGS. 16A and 16B show variations of the cross-sectional structure of the photomask shown in the plan view of FIG. 15. Specifically, FIGS. 16A and 16B show the cross-sectional structures of portions corresponding to lines AB and CD of FIG. 15.

First, in the photomask of FIG. 16A, on a transparent substrate 150 of, for example, quartz, a translucent semi-light-shielding film 151 for causing an identical phase difference (i.e., a phase difference not less than (−30+360×n) degrees and not more than (30+360×n) degrees (wherein n is an integer)) in exposing light with reference to the transparent portions 104A and 104B is formed. Hereinafter, causing an identical phase difference means causing a phase difference not less than (−30+360×n) degrees and not more than (30+360×n) degrees (wherein n is an integer)). As an example of such a semi-light-shielding film 151, a metal thin film in which n is 0 (namely, for causing a phase difference not less than −30 degrees and not more than 30 degrees) can be used. In this case, the transparent portions 104A and 104B correspond to bare regions of the transparent substrate 150, and the semi-light-shielding portion 102 corresponds to a bare region of the semi-light-shielding film 151 deposited on the transparent substrate 150. Furthermore, on the semi-light-shielding film 151, a phase shifting film 152 for causing an opposite phase difference (i.e., a phase difference not less than (150+360×n) degrees and not more than (210+360×n) degrees (wherein n is an integer)) in the exposing light with reference to the transparent portions 104A and 104B is formed. As a material for the phase shifting film 152, for example, a transparent glass material including $SiO_2$ as a principal component can be used. Hereinafter, causing an opposite phase difference means causing a phase difference not less than (150+360×n) degrees and not more than (210+360×n) degrees (wherein n is an integer)). In this case, the phase shifter portion 103 corresponds to a bare region of the phase shifting film 152 deposited on the semi-light-shielding film 151. Furthermore, the light-shielding portion 101 is formed by further stacking, on the phase shifting film 152, a light-shielding film 153 substantially not transmitting the exposing light.

In the aforementioned mask structure of FIG. 16A, arbitrary mask layout including the transparent portions 104A and 104B, the light-shielding portion 101, the semi-light-shielding portion 102 and the phase shifter portion 103 can be formed by preparing the transparent substrate 150 on which the semi-light-shielding film 151, the phase shifting film 152 and the light-shielding film 153 are successively stacked and selectively removing the light-shielding film 153, the phase shifting film 152 and the semi-light-shielding film 151. In particular, when a metal thin film is used as the semi-light-shielding film 151, the processing accuracy for the semi-light-shielding film 151 is improved, and hence, the processing accuracy for the semi-light-shielding portion 102 provided around the light-shielding portion 101 or the phase shifter portion 103 used as the mask pattern can be improved.

Next, in the photomask shown in FIG. 16B, on a transparent substrate 150 of, for example, quartz, a first translucent phase shifting film 154 for causing an opposite phase difference in exposing light with respect to the transparent substrate 150 (a part thereof not trenched) is formed. As the material for the first phase shifting film 154, for example, a compound of silicon oxide and a metal (such as $MoSiO_2$) can be used. In this case, the transparent portions 104A and 104B correspond to regions of the transparent substrate 150 in which the first phase shifting film 154 is removed and that are trenched for causing an opposite phase difference in the exposing light. Also, a second phase shifting film 152 (which is the same as the phase shifting film 152 of the photomask of FIG. 16A) for causing an opposite phase difference in the exposing light with respect to the transparent substrate 150 (the part thereof not trenched) is stacked on the first phase shifting film 154. In this case, the semi-light-shielding portion 102 corresponds to a bare region of the first phase shifting film 154 deposited on the transparent substrate 150, and the phase shifter portion 103 corresponds to a bare region of the second phase shifting film 152 deposited on the first phase shifting film 154. Furthermore, the light-shielding portion 101 is formed by further stacking a light-shielding film 153 substantially not transmitting the exposing light on the second phase shifting film 152.

In the aforementioned mask structure of FIG. 16B, phase differences among the respective portions can be independently controlled in accordance with the formation and processing of the phase shifting films, and hence, the phase differences among the respective portions can be accurately controlled.

Although each of the semi-light-shielding film 151, the phase shifting films 152 and 154 and the like is described as a single-layered film in each of the photomasks of FIGS. 16A and 16B, it goes without saying that any of these films may be formed as a multilayered film.

Modification 2 of Embodiment 1

A photomask according to Modification 2 of Embodiment 1 of the invention will now be described with reference to the accompanying drawings.

Figure 17A:
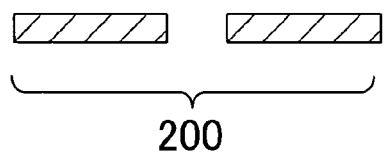
FIG. 17A is a diagram for showing the shape of a desired resist pattern to be formed by using a photomask according to Modification 2 of Embodiment 1 of the invention.
Figure 17B:
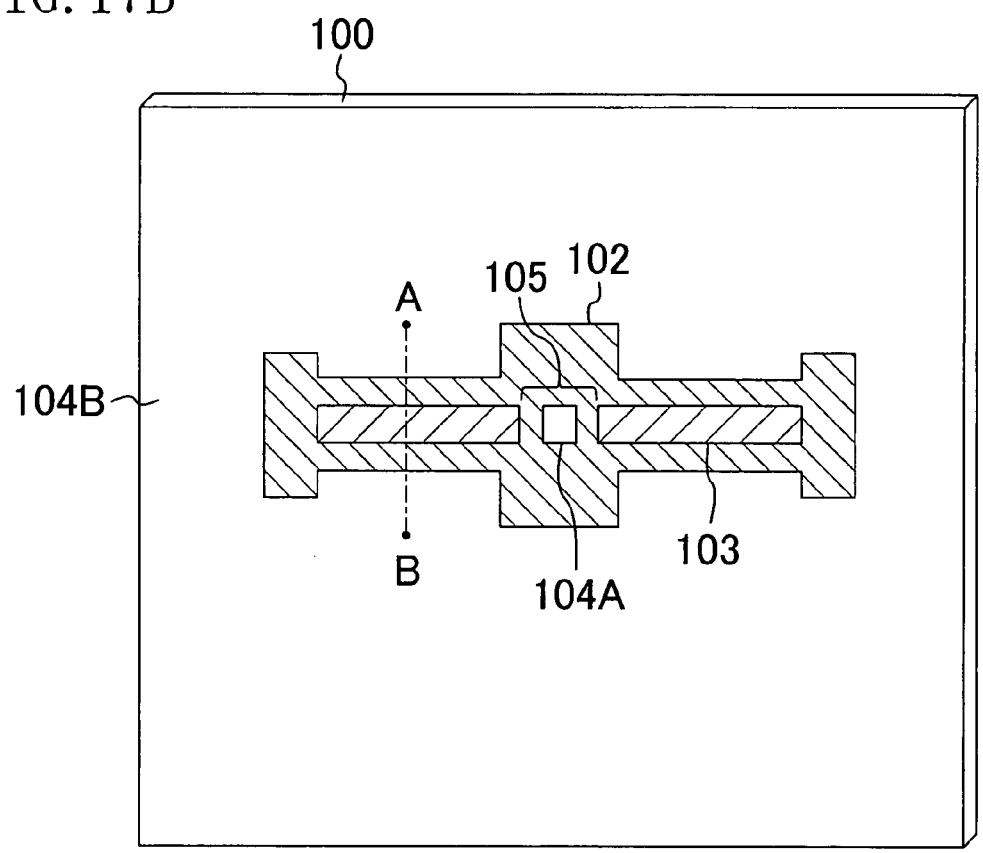
FIG. 17B is a plan view of the photomask of Modification 2 of Embodiment 1 of the invention and FIG. 17C is a cross-sectional view of a portion corresponding to line AB of FIG. 17B.

FIG. 17A is a diagram for showing the shape of a desired resist pattern and FIG. 17B is a plan view of the photomask according to Modification 2 of Embodiment 1. It is noted that a transparent substrate is perspectively shown in FIG. 17B.

As shown in FIG. 17A, the desired pattern is a pair of rectangular resist patterns 200 opposing and close to each other.

As shown in FIG. 17B, in the photomask of this modification, a transparent portion 104 (a second transparent portion 104B) is provided over a sufficiently large area on the transparent substrate 100. Also, a mask pattern including a pair of rectangular phase shifter portions 103 opposing and close to each other is provided on the transparent substrate 100 in a position corresponding to the resist patterns (the desired pattern) 200 to be formed on a wafer through exposure. In other words, a difference of this modification from Embodiment 1 is that the mask pattern includes the phase shifter portion 103 instead of a light-shielding portion similarly to Modification 1 of Embodiment 1. The mask pattern corresponding to the resist patterns 200 includes a pair of pattern regions (a pair of phase shifter portions 103) opposing and close to each other also in this modification as in Modification 1 of Embodiment 1. As a characteristic of this modification, a semi-light-shielding portion 102 is provided between a first transparent portion 104A disposed in a region 105 sandwiched between the pair of pattern regions (a pattern opposing region) and each of the pattern regions (namely, each of the phase shifter portions 103). In other words, in the opposing region 105, the first transparent portion 104A is provided in a position away from each of the phase shifter portions 103 corresponding to the pattern regions with the semi-light-shielding portion 102 sandwiched therebetween. In this modification, the semi-light-shielding portion 102 is also provided around corners of each phase shifter portion 103 (i.e., each pattern region) including the corners thereof disposed on a side of the pattern opposing region 105.

In the structure of the photomask of this modification described above, also in the case where the phase shifter portion is used as a mask pattern instead of a light-shielding portion, the MEF can be reduced in the pattern opposing region, and the roundness of corners of a resist pattern to be formed and the recess of an end derived from the roundness can be suppressed. Accordingly, in the case where the photomask of this modification is applied to the formation of a pattern having a circuit layout including a plurality of transistors adjacent to one another, the opposing region between gate layer patterns and the external length of a gate in the opposing region can be reduced, so that transistors can be disposed at a high density for realizing high integration of an LSI.

Furthermore, the semi-light-shielding portion 102 is provided so as to surround the first transparent portion 104A disposed in the pattern opposing region 105 in this modification as in Embodiment 1. Such a structure is preferred particularly when a space dimension between resist patterns is fine.

Moreover, the semi-light-shielding portion 102 is provided so as to surround the periphery of the mask pattern (namely, the periphery of the phase shifter portions 103 corresponding to the respective pattern regions) in this modification as in Embodiment 1. When such a structure is employed, the optical proximity correction (OPC) can be easily performed in mask pattern creation.

It is noted that the semi-light-shielding portion 102 is defined in this modification in the same manner as in Embodiment 1. Also, the phase shifter portion 103 transmits light, and there is an opposite phase relationship (specifically, a relationship with a phase difference not less than (150+360×n) degrees and not more than (210+360×n) degrees (wherein n is an integer)) between light passing through the phase shifter portion 103 and light passing through the transparent portions 104A and 104B.

Although a phase shifter portion with low transmittance is assumed as the phase shifter portion 103 used instead of a light-shielding portion in Modification 1 of Embodiment 1, a phase shifter portion with high transmittance is assumed as the phase shifter portion 103 in this modification. In other words, since the phase shifter portion 103 is formed by stacking a phase shifting film on a semi-light-shielding film in Modification 1 of Embodiment 1, the transmittance of the phase shifter portion 103 is unavoidably lower than the transmittance of the semi-light-shielding film On the contrary, in this modification, the transmittance of the phase shifter portion 103 can be made higher than the transmittance of the semi-light-shielding film as described below. It is noted that a phase shifter portion with low transmittance means a phase shifter portion by which a resist is not exposed in a part corresponding to the center of the phase shifter portion even when the phase shifter portion has a large width, and specific transmittance thereof is lower than 15% at most and is preferably not more than 9%. Alternatively, a phase shifter portion with high transmittance means a phase shifter portion by which a resist is exposed in a part corresponding to the center of the phase shifter portion when the phase shifter portion has a large width, and specific transmittance thereof is at least 15% or more and is preferably 25% or more.

Moreover, in this modification, the phase shifter portion 103 with high transmittance is used when a resist pattern to be formed is a fine line pattern with a line width not more than a half of λ/NA. In forming a fine line pattern with a line width not more than a half of λ/NA, the phenomenon in question occurring as the roundness of corners in the shape of a resist pattern is remarkably caused as a phenomenon of taper of a line end or a phenomenon of recess of a line end.

Figure 17C:
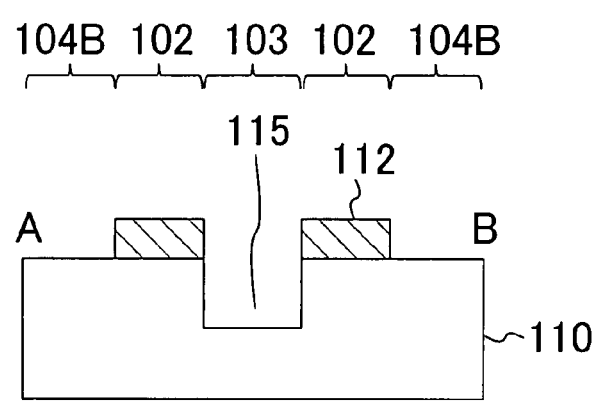

FIG. 17C shows an exemplified cross-sectional structure of the photomask shown in the plan view of FIG. 17B. Specifically, FIG. 17C shows a cross-sectional structure of a portion corresponding to line AB of FIG. 17B. As shown in FIG. 17C, in this modification, a quartz substrate 110 is used as an example of the transparent substrate, and the transparent portions 104A and 104B correspond to bare regions of the quartz substrate 110. The semi-light-shielding portion 102 is formed by stacking a metal thin film 112 of, for example, Mo as a semi-light-shielding film on the quartz substrate 110. The material for the metal thin film 112 may be Ta or the like apart from Mo. Specifically, transmittance of approximately 5 through 50% against light of a wavelength of 193 nm can be realized by using a metal thin film 112 with a thickness of approximately 10 through 30 nm. The phase shifter portion 103 is formed by forming an opening in the metal thin film (the semi-light-shielding film) 112 used as the semi-light-shielding portion 102 and trenching the quartz substrate 110 within the opening by a depth for inverting the phase of the exposing light. In other words, the phase shifter portion 103 is formed as a trench portion 115 of the quartz substrate 110. Owing to this structure, the phase shifter portion 103 is made of a material having the same transmittance as the transparent substrate, and hence, the photomask of this modification can be realized by using the phase shifter portion 103 having very high transmittance.

The photomask of this modification having the aforementioned structure exhibits good pattern formation characteristics, and specifically, the MEF reducing effect and the effect to suppress roundness of resist pattern corners (and particularly, an effect to suppress the taper of a line end), in forming a pattern on a wafer in the same manner as in Embodiment 1, which will now be described on the basis of a result of simulation. Exposure conditions employed in the optical calculation in the simulation are an exposure wavelength λ of 193 nm and a numerical aperture NA of 0.85. Also, as the illumination conditions, ⅔ annular illumination having the outer diameter with a degree of interference of 0.8 and the inner diameter with a degree of interference of 0.53 is used. Furthermore, the transmittance of a semi-light-shielding portion against the exposing light is 15%, and the transmittance of a phase shifter portion against the exposing light is 100%.

In the case where a phase shifter portion is used as a mask pattern in forming a fine line pattern with a dimension close to the resolution limit, namely, a dimension not more than 0.4× λ/NA, the transmittance of the phase shifter portion against exposing light is preferably as high as possible, and transmittance of 100% is ideally the most preferred. In a mask structure in which an opening is formed in a semi-light-shielding film and a phase shifter portion is provided in this opening as in this modification, a phase shifter portion having higher transmittance than a semi-light-shielding portion can be easily formed. Furthermore, as described in Embodiment 1, the transmittance of a semi-light-shielding portion is preferably 30% or less, and hence, the mask structure of this modification in which a phase shifter portion with transmittance exceeding 30% can be easily realized by forming an opening in a semi-light-shielding film used as a semi-light-shielding portion is particularly preferable for forming a fine line pattern.

FIGS. 18A, 18B, 19A, 19B, 20A and 20B are diagrams for explaining that the taper of a line end of a resist pattern can be suppressed by using the photomask of this modification. In FIGS. 18A, 18B, 19A, 19B, 20A and 20B, a pattern opposing region and its periphery are enlarged along the pattern opposing direction.

Figure 18A:
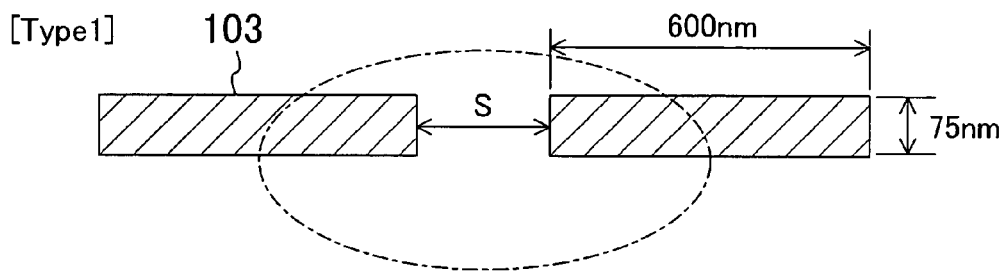
FIG. 18A is a plan view of a photomask of a comparative example including a phase shifter portion alone and FIG. 18B is a diagram for showing a pair of resist patterns formed through exposure of the photomask of FIG. 18A as a result of simulation.

First, FIG. 18A shows the plane structure of a photomask of a comparative example including a phase shifter portion alone. Specifically, in the photomask of FIG. 18A, a pair of rectangular patterns (phase shifter portions 103) opposing and close to each other are provided as a mask pattern. In this case, each rectangular pattern has a size of 600 nm×75 nm, and a distance between the rectangular patterns (namely, an opposing distance), that is, the length of an opposing region along the opposing direction of the rectangular patterns (an opposing length), is a length S. In the photomask of FIG. 18A, the respective rectangular patterns are arranged so that the width (an opposing width) of the opposing region along a direction vertical to the opposing direction of the rectangular patterns can be defined by a side of each rectangular pattern with a length of 75 nm. Hereinafter, the photomask shown in FIG. 18A is designated as a photomask "Type 1".

Figure 18B:
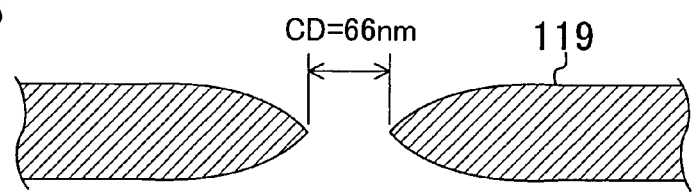

FIG. 18B shows a result of simulation for forming a pair of resist patterns through exposure of the photomask of FIG. 18A for attaining a finished dimension (a CD value) of the opposing distance of 66 nm. As is understood from the simulation result shown in FIG. 18B, a pair of resist patterns 119 formed by using the photomask of FIG. 18A have tapered line ends, and hence, the CD value of the opposing distance of 66 nm can be attained merely between the tips of the tapered line ends. In other words, a pattern width cannot be sufficiently secured in the resist patterns 119 in the vicinity of a part where the CD value of the opposing distance of 66 nm is attained.

Figure 19A:
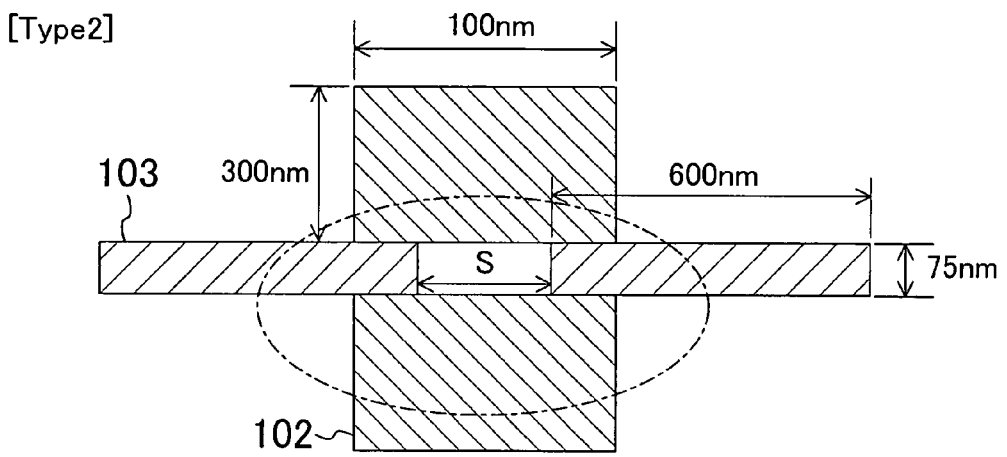
FIG. 19A is a plan view of a photomask further including a semi-light-shielding portion provided in an opposing region between phase shifter portions of the photomask of FIG. 18A

FIG. 19A shows a plane structure of a photomask obtained by further providing semi-light-shielding portions 102 each with a size of 300 nm×100 nm around the opposing region (specifically, in upper and lower regions of the opposing region) positioned between the rectangular patterns (the phase shifter portions 103) of the photomask of FIG. 18A. In the photomask of FIG. 19A, the semi-light-shielding portions 102 are provided so as to overlap the rectangular patterns. At this point, the width of the overlap between each rectangular pattern (each phase shifter portion 103) and the semi-light-shielding portion 102 is (100 nm−S nm)/2. Hereinafter, the photomask shown in FIG. 19A is designated as a photomask "Type 2".

Figure 19B:
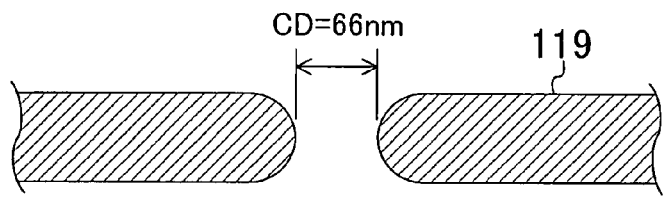
FIG. 19B is a diagram for showing a pair of resist patterns formed through exposure of the photomask of FIG. 19A as a result of simulation.

FIG. 19B shows a result of simulation for forming a pair of resist patterns through exposure of the photomask of FIG. 19A for attaining a finished dimension (a CD value) of the opposing distance of 66 nm. As is understood from the simulation result shown in FIG. 19B, the taper of line ends is suppressed in a pair of resist patterns 119 formed by using the photomask of FIG. 19A. As a result, a pattern width can be sufficiently secured in each resist pattern 119 in the vicinity of a part where the CD value of the opposing distance of 66 nm is attained.

Figure 20A:
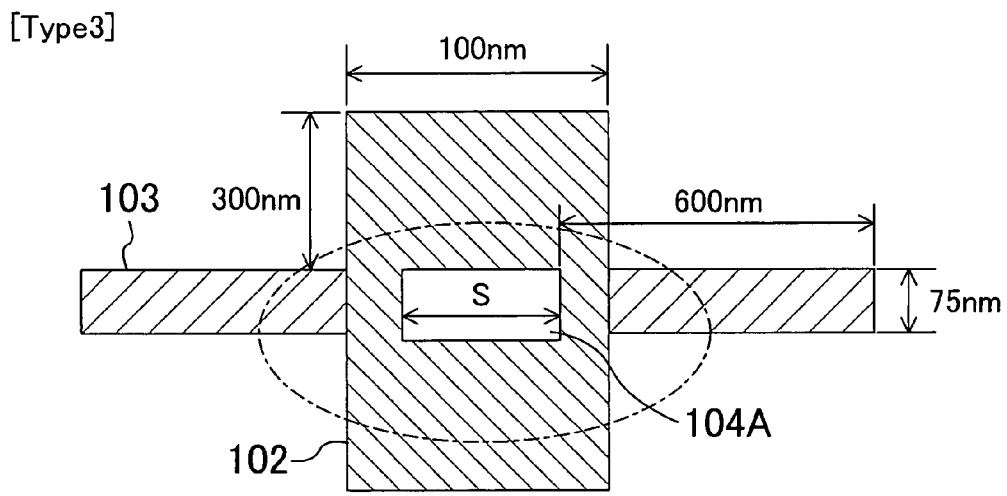
FIG. 20A is a plan view of a photomask further including a semi-light-shielding portion provided between the phase shifter portion and a transparent portion within an opposing region of the photomask of FIG. 19A

FIG. 20A shows a plane structure of a photomask obtained by further providing a semi-light-shielding portion 102 between each rectangular pattern (each phase shifter portion 103) and a first transparent portion 104A disposed within the opposing region of the photomask of FIG. 19A. Hereinafter, the photomask shown in FIG. 20A is designated as a photomask "Type 3". In the photomask "Type 3", a part (in the vicinity of the opposing region) of the rectangular pattern (the phase shifter portion 103) of the photomask of FIG. 19A is replaced with the semi-light-shielding portion 102, and the opposing distance S corresponds to a length along the opposing direction of a part of the opposing region excluding the semi-light-shielding portion 102 (i.e., the first transparent portion 104A). In this case, the width of the semi-light-shielding portion 102 sandwiched between each rectangular pattern (each phase shifter portion 103) and the first transparent portion 104A disposed within the opposing region is (100 nm−S nm)/2.

Figure 20B:
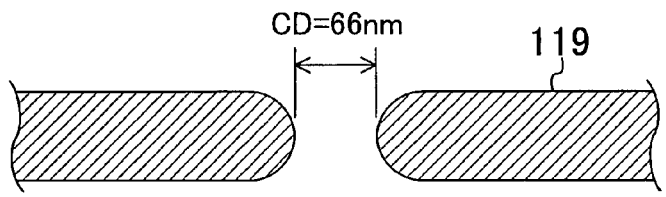
FIG. 20B is a diagram for showing a pair of resist patterns formed through exposure of the photomask of FIG. 20A as a result of simulation.

FIG. 20B shows a result of simulation for forming a pair of resist patterns through exposure of the photomask of FIG. 20A for attaining a finished dimension (a CD value) of the opposing distance of 66 nm. As is understood from the simulation result shown in FIG. 20B, the taper of line ends is suppressed in a pair of resist patterns 119 formed by using the photomask of FIG. 20A, namely, the photomask of this modification, in the same manner as in the simulation result of the photomask "Type 2" shown in FIG. 19B. As a result, a pattern width can be sufficiently secured in each resist pattern 119 in the vicinity of a part where the CD value of the opposing distance of 66 nm is attained.

Figure 21:
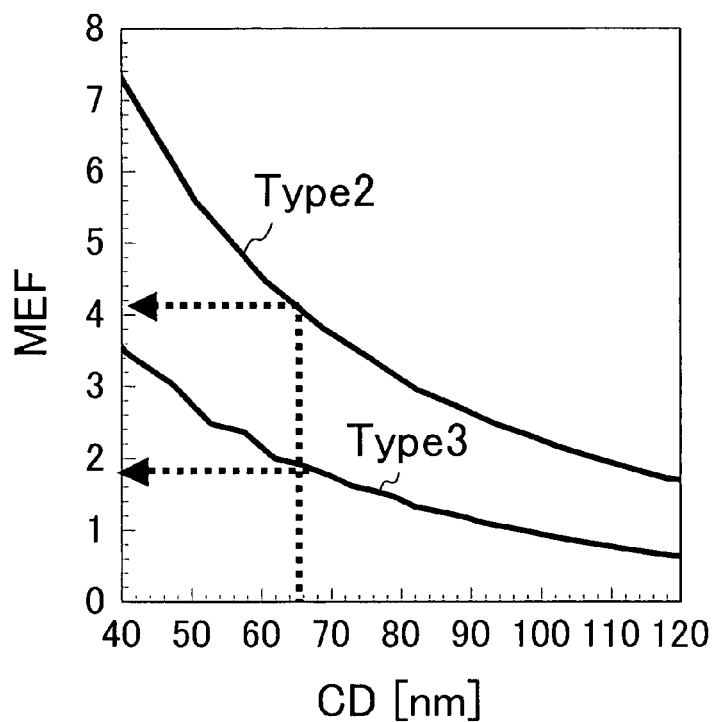
FIG. 21 is a diagram for showing a result of simulation for MEF of a CD value of an opposing distance between resist patterns formed by using each of the photomasks of FIGS. 19A and 20A.

FIG. 21 is a diagram for showing a result of simulation for MEF of a CD value of an opposing distance between resist patterns formed through exposure using each of the photomasks "Type 2" and "Type 3".

As shown in FIG. 21, in using the photomask "Type 2", it is difficult to form a resist pattern with MEF of approximately 1 even when the CD value of the opposing distance is 100 nm, and the MEF is increased to approximately 4 when the CD value of the opposing distance is reduced to 66 nm. It is noted that the opposing distance S of the mask pattern for attaining a CD value of the opposing distance of 66 nm by using the photomask "Type 2" is 72 nm.

Furthermore, as shown in FIG. 21, in using the photomask "Type 3", a resist pattern can be formed with MEF not more than 1 when the CD value of the opposing distance is 100 nm, and the MEF can be suppressed to approximately 2 or less when the CD value of the opposing distance is reduced to 66 nm. In other words, a very high MEF improving effect can be attained by using the photomask "Type 3". In the case where the CD value of the opposing distance of 66 nm is attained by using the photomask "Type 3", the opposing distance S of the mask pattern is 24 nm, and the width (the length along the opposing direction) of the semi-light-shielding portion 102 disposed in the opposing region is 38 nm. Furthermore, it is when the CD value of the opposing distance is reduced to approximately 40 nm that the MEF of the CD value of the opposing distance is increased beyond 4 in using the photomask "Type 3". In this case, the opposing distance S of the mask pattern is 32 nm, and the width (the length along the opposing direction) of the semi-light-shielding portion 102 disposed in the opposing region is 34 nm.

In this manner, the increase of the MEF can be suppressed in realizing a fine CD value by using the photomask "Type 3", namely, the photomask of this modification, as compared with the case where the photomask "Type 2" is used. Specifically, in order to stably form a resist pattern with the increase of the MEF suppressed, the CD value of the opposing distance between the resist patterns can be reduced to merely approximately 66 nm in using the photomask "Type 2", but the CD value can be reduced to approximately 40 nm in using the photomask "Type 3".

Accordingly, in forming a pattern with an opposing distance smaller than $\lambda/NA$ (which is 227 nm in the above-described simulation), the MEF of the opposing distance between resist patterns can be improved by employing the structure of the photomask "Type 3", namely, the photomask of this modification, and specifically, the structure in which a semi-light-shielding portion is provided between a transparent portion disposed in a pattern opposing region and each pattern region (which is a phase shifter portion in this modification). This MEF improving effect is remarkably exhibited in forming a pattern with an opposing distance not more than $0.5 \times \lambda/NA$. However, a distance not less than $0.02 \times \lambda/NA$ is necessary for making the opposing distance optically significant as an opposing distance between pattern regions separated from each other on a photomask.

The principle of the MEF improving effect attained in this modification is the same as that described in Modification 1 of Embodiment 1. Specifically, the MEF improving effect (reducing effect) of this modification is particularly remarkably exhibited when a mask pattern used for forming a fine line pattern includes a phase shifter portion with very high transmittance. A phase shifter portion with high transmittance means a phase shifter portion by which a resist is exposed in a part corresponding to the center of the phase shifter portion when the phase shifter has a large width, and the specific transmittance thereof is at least 15% or more and is preferably 25% or more. In other words, a phase shifter portion with very high transmittance means a phase shifter portion with transmittance of 25% or more.

In order to simultaneously attain the MEF reducing effect and the effect to suppress the roundness of resist pattern corners by using the photomask of this modification, the transmittance of the semi-light-shielding portion is preferably not less than 5% and not more than 30% in the same manner as in Embodiment 1, and in particular, in order to sufficiently attain both the effects, the transmittance of the semi-light-shielding portion is preferably not less than 10% and not more than 20%.

Furthermore, in order to stably form a resist pattern even when the CD value of the opposing distance between resist patterns is reduced in this modification, a transparent portion disposed in a pattern opposing region is surrounded with a semi-light-shielding portion and the width, along the direction vertical to the pattern opposing direction, of the transparent portion is set to be smaller than the length of a side extending along the vertical direction (i.e., the opposing width) of each rectangular pattern (each phase shifter portion) in the same manner as in Embodiment 1.

Furthermore, since a semi-light-shielding portion disposed in a pattern opposing region is provided so as to surround the periphery of the mask pattern (i.e., the periphery of respective phase shifter portions corresponding to pattern regions) also in this modification as in Embodiment 1, the optical proximity correction for adjusting the dimension of a resist pattern including the dimension of a part in the vicinity of the opposing region can be easily performed.

The dimension along the pattern opposing direction of the semi-light-shielding portion disposed around the pattern opposing region may be longer or shorter than the opposing distance between pattern regions also in this modification as in Embodiment 1. However, in the same manner as in Embodiment 1, for preventing the roundness of resist pattern corners, the dimension (the width), along the direction vertical to the pattern opposing direction, of the semi-light-shielding portion disposed in and around the pattern opposing region is preferably larger than the dimension (the opposing width) along the vertical direction of the pattern region made of the phase shifter portion (namely, the semi-light-shielding portion is preferably provided not only in the pattern opposing region but also outside (in the periphery) of the opposing region).

Moreover, in this modification, the semi-light-shielding portion 102 provided in the pattern opposing region need not be in contact with the rectangular pattern made of the phase shifter portion 103, but the semi-light-shielding portion 102 and the phase shifter portion 103 may be spaced from each other by providing, between the semi-light-shielding portion 102 and the phase shifter portion 103, a transparent portion with a dimension not affecting an optical image formed by using the photomask.

Furthermore, the semi-light-shielding portion 102 provided in the pattern opposing region need not completely surround the first transparent portion 104A, but a transparent portion with a dimension not affecting an optical image formed by using the photomask may be disposed so as to divide the semi-light-shielding portion 102.

Moreover, in the case where the mask pattern of this embodiment shown in FIG. 17A (that is, a pair of phase shifter portions 103) is arranged in a plurality of lines along the direction vertical to the pattern opposing direction, in other words, in the case where pattern opposing regions are adjacent to each other along the vertical direction, the semi-light-shielding portions 102 provided around the respective pattern opposing regions may be mutually connected. In other words, the semi-light-shielding portion 102 may be continuously provided for respective mask patterns each including a pair of phase shifter portions 103.

Figure 22:
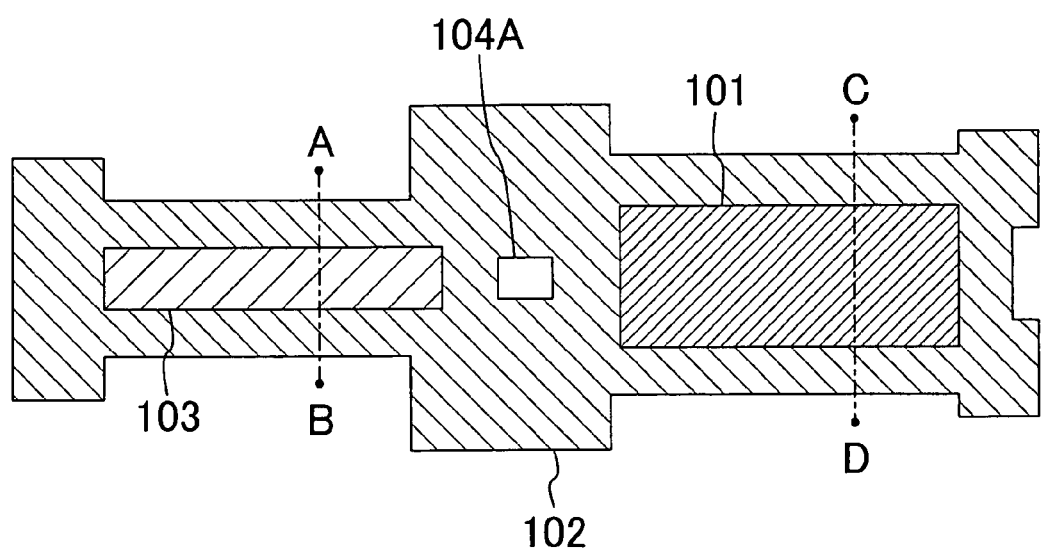
FIG. 22 is a diagram for showing a variation of a plane structure of the photomask of Modification 2 of Embodiment 1 of the invention.

In the photomask of this modification described so far, a pair of pattern regions opposing each other are both phase shifter portions. Instead, for example, one of the pair of opposing pattern regions may be a phase shifter portion 103 and the other may be a light-shielding portion 101 as shown in FIG. 22. In the photomask shown in FIG. 22, a semi-light-shielding portion 102 is provided between a first transparent portion 104A disposed in a pattern opposing region and each pattern region (namely, each of the phase shifter portion 103 and the light-shielding portion 101). In other words, in the pattern opposing region, the first transparent portion 104A is provided in a position away from each of the phase shifter portion 103 and the light-shielding portion 101 corresponding to the pattern regions with the semi-light-shielding portion 102 sandwiched therebetween. Also, the semi-light-shielding portion 102 is provided also around corners of each of the phase shifter portion 103 and the light-shielding portion 101 including corners thereof disposed on a side of the pattern opposing region.

FIGS. 23A through 23D show variations of the cross-sectional structure of the photomask shown in the plan view of FIG. 22. Specifically, each of FIGS. 23A through 23D shows the cross-sectional structure of portions corresponding to lines AB and CD of FIG. 22. As a difference of the cross-sectional structures of the photomask of this modification shown in FIGS. 23A through 23D from that of Modification 1 of Embodiment 1, a phase shifter portion having higher transmittance than a semi-light-shielding portion can be formed.

Figure 23A:
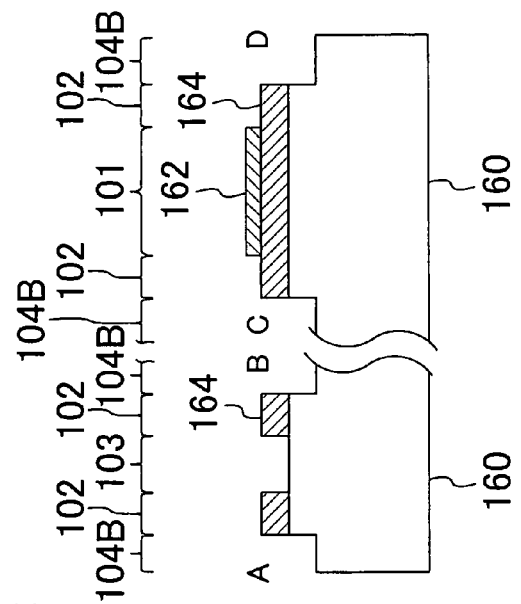
FIGS. 23A, 23B, 23C and 23D are cross-sectional views of portions corresponding to lines AB and CD of FIG. 22.

First, in the photomask of FIG. 23A, on a transparent substrate 160 of, for example, quartz, a translucent semi-light-shielding film 161 for causing an identical phase difference (i.e., a phase difference not less than (−30+360×n) degrees and not more than (30+360×n) degrees (wherein n is an integer)) in exposing light with reference to the transparent portions 104A and 104B is formed. Hereinafter, causing an identical phase difference means causing a phase difference not less than (−30+360×n) degrees and not more than (30+360×n) degrees (wherein n is an integer)). As an example of such a semi-light-shielding film 161, a metal thin film in which n is 0 (namely, for causing a phase difference not less than −30 degrees and not more than 30 degrees) can be used. In this case, the transparent portions 104A and 104B correspond to bare regions of the transparent substrate 160, and the semi-light-shielding portion 102 corresponds to a bare region of the semi-light-shielding film 161 deposited on the transparent substrate 160. Furthermore, a region for the phase shifter portion 103 on the transparent substrate 160 is trenched by a depth for causing an opposite phase difference (i.e., a phase difference not less than (150+360×n) degrees and not more than (210+360×n) degrees (wherein n is an integer)) in the exposing light with reference to the transparent portions 104A and 104B. Thus, the phase shifter portion 103 is formed as a trench portion 160a of the transparent substrate 160. Hereinafter, causing an opposite phase difference means causing a phase difference not less than (150+360×n) degrees and not more than (210+360×n) degrees (wherein n is an integer)). Furthermore, the light-shielding portion 101 is formed by further stacking, on the semi-light-shielding film 161, a light-shielding film 162 substantially not transmitting the exposing light.

In the aforementioned mask structure of FIG. 23A, arbitrary mask layout including the transparent portions 104A and 104B, the light-shielding portion 101, the semi-light-shielding portion 102 and the phase shifter portion 103 can be formed by preparing the transparent substrate 160 on which the semi-light-shielding film 161 and the light-shielding film 162 are successively stacked, selectively removing the light-shielding film 162 and the semi-light-shielding film 161 and trenching the transparent substrate 160. In particular, when a metal thin film is used as the semi-light-shielding film 161, the processing accuracy for the semi-light-shielding film 161 is improved, and hence, the processing accuracy for the semi-light-shielding portion 102 provided around the light-shielding portion 101 or the phase shifter portion 103 corresponding to the mask pattern can be improved.

Figure 23C:
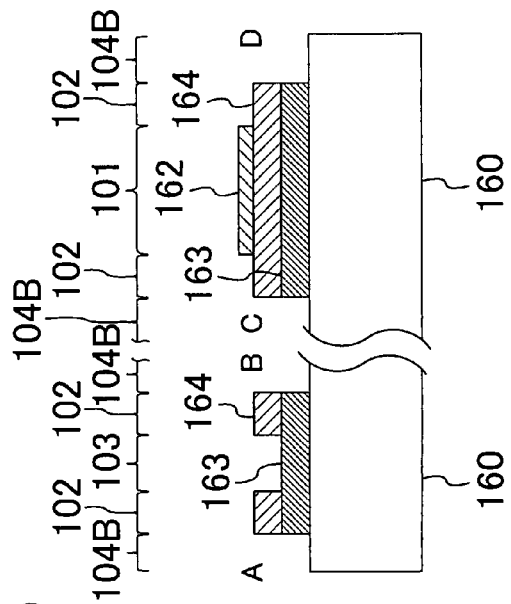
Figure 23B:
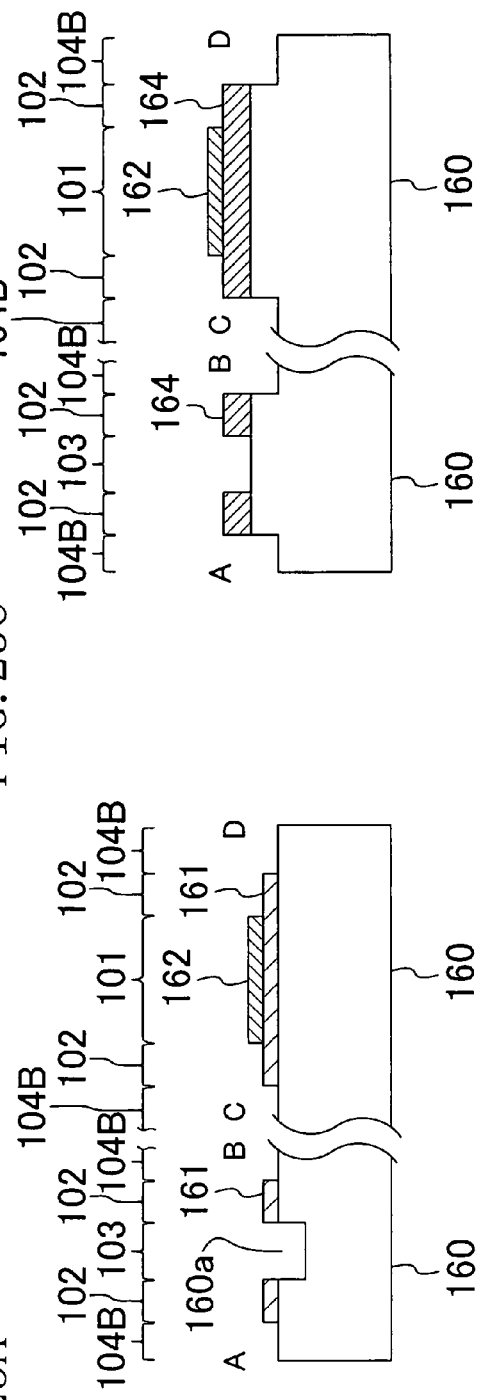

Next, in the photomask shown in FIG. 23B, on a transparent substrate 160 of, for example, quartz, a phase shifting film 163 for causing an opposite phase difference in exposing light with respect to a bare region of the transparent substrate 160 (corresponding to a phase shifter portion 103 in this mask) is formed. As the material for the phase shifting film 163, for example, a transparent glass material including $SiO_2$ as a principal component can be used. In this case, the transparent portions 104A and 104B correspond to bare regions of the phase shifting film 163 deposited on the transparent substrate 160, and the phase shifter portion 103 corresponds to a bare region of the transparent substrate 160 in which the phase shifting film 163 is removed. Also, a translucent semi-light-shielding film 161 for causing an identical phase difference in the exposing light with respect to the transparent portions 104A and 104B is stacked on the phase shifting film 163. In this case, the semi-light-shielding portion 102 corresponds to a bare region of the semi-light-shielding film 161 deposited on the phase shifting film 163. Furthermore, the light-shielding portion 101 is formed by further stacking a light-shielding film 162 substantially not transmitting the exposing light on the semi-light-shielding film 161.

In the aforementioned mask structure of FIG. 23B, the phase shifting film 163 is used for adjusting the phase of the phase shifter portion 103 in accordance with the thickness of the phase shifting film 163. Accordingly, as compared with the case where the phase of the phase shifter portion 103 is adjusted in accordance with the depth for trenching the transparent substrate 160, the phase of the phase shifter portion 103 can be more accurately controlled.

Next, in the photomask shown in FIG. 23C, on a transparent substrate 160 of, for example, quartz, a translucent phase shifting film 164 for causing an opposite phase difference in exposing light with respect to a bare region of the transparent substrate 160 (a part thereof not trenched) is formed. As the material for the phase shifting film 164, for example, a compound of silicon oxide and a metal (such as $MoSiO_2$) can be used. In this case, the transparent portions 104A and 104B correspond to a region on the transparent substrate 160 in which the phase shifting film 164 is removed and that is trenched by a depth for causing an opposite phase difference in the exposing light. Furthermore, the phase shifter portion 103 corresponds to a bare region of the transparent substrate 160 in which the phase shifting film 164 is removed. Also, the semi-light-shielding portion 102 corresponds to a bare region of the phase shifting film 164 deposited on the transparent substrate 160. Moreover, the light-shielding portion 101 is formed by stacking, on the phase shifting film 164, a light-shielding film 162 substantially not transmitting the exposing light.

In the plane structure of the photomask of the present invention, there is no need to form a finer pattern for a transparent portion than a phase shifter portion on the basis of the principle of the invention. Also, a trench portion of a transparent substrate to be used as a phase shifter portion is generally formed by etching. When a pattern to be processed in the etching is finer, however, there occurs a micro loading effect that a trenched depth is varied in accordance with the pattern dimension. However, in the structure shown in FIG. 23C, the trench portion of the transparent substrate 160 is used not as the phase shifter portion 103 but as the transparent portions 104A and 104B, and there is no need to form a finer pattern for the transparent portions 104A and 104B than the phase shifter portion 103 as described above. Therefore, the micro loading effect can be avoided in trenching the transparent substrate 160, and hence, the mask processing can be eased.

Figure 23D:
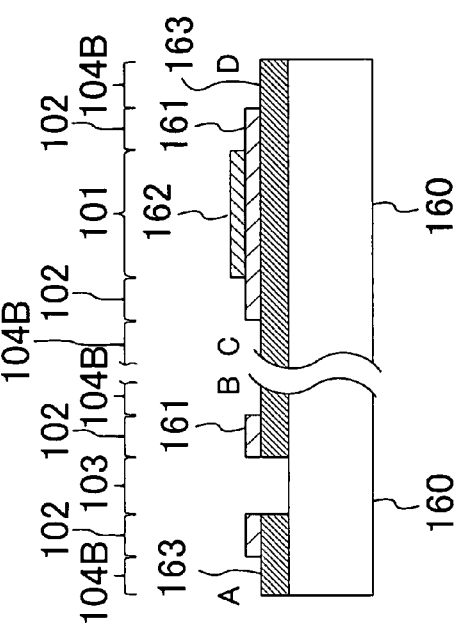

Next, in the photomask shown in FIG. 23D, on a transparent substrate 160 of, for example, quartz, a first phase shifting film 163 (the same as the phase shifting film 163 of FIG. 23B) for causing an opposite phase difference in exposing light with respect to a bare region of the transparent substrate 160 (corresponding to the transparent portions 104A and 104B in this mask) is formed. In this case, the transparent portions 104A and 104B correspond to the bare region of the transparent substrate 160, and the phase shifter portion 103 corresponds to a bare region of the first phase shifting film 163 deposited on the transparent substrate 160. Also, a translucent second phase shifting film 164 (the same as the phase shifting film 164 of the photomask of FIG. 23C) for causing an opposite phase difference in the exposing light with respect to the transparent portions 104A and 104B is stacked on the first phase shifting film 163. In this case, the semi-light-shielding portion 102 corresponds to a bare region of the second phase shifting film 164 deposited on the first phase shifting film 163. Furthermore, the light-shielding portion 101 is formed by stacking, on the second phase shifting film 164, a light-shielding film 162 substantially not transmitting the exposing light.

In the aforementioned mask structure of FIG. 23D, the phase shifting film 163 is used for adjusting the phase of the phase shifter portion 103 in accordance with the thickness of the phase shifting film 163. Therefore, as compared with the case where the phase of the phase shifter portion 103 is adjusted in accordance with a depth for trenching the transparent substrate 160, the phase of the phase shifter portion 103 can be more accurately controlled.

In the photomask having the cross-sectional structure shown in any of FIGS. 23B through 23D, the thickness of the film used as the phase shifter portion causing an opposite phase difference or the thickness of the film used as the semi-light-shielding portion causing an identical phase difference needs to be approximately several hundred nm for phase adjustment. On the contrary, in the photomask having the cross-sectional structure of FIG. 23A, a thin film with a thickness of approximately several tens nm at most is used as the semi-light-shielding portion 102, and therefore, the microprocessing in performing patterning for the mask processing can be easily performed. In this case, examples of the metal material usable for the thin film are metals such as Cr (chromium), Ta (tantalum), Zr (zirconium), Mo (molybdenum) and Ti (titanium) and alloys of these metals. Specific examples of the alloy are Ta—Cr alloy, and a compound of Zr, Mo or Ti with Si.

In this manner, in the photomask having the cross-sectional structure shown in FIG. 23A, since the film to be processed is the semi-light-shielding film 161 made of a metal thin film, the microprocessing for the mask processing can be eased. Accordingly, the photomask shown in FIG. 23A is good at easiness in the mask processing.

Although each of the semi-light-shielding film 161, the phase shifting films 163 and 164 and the like is described as a single-layered film in each of the photomasks of FIGS. 23A through 23D, it goes without saying that any of these films may be formed as a multilayered film.

Modification 3 of Embodiment 1

A photomask according to Modification 3 of Embodiment 1 of the invention will now be described with reference to the accompanying drawings.

FIG. 28A is a diagram for showing the shape of a desired resist pattern and FIG. 28B is a plan view of the photomask according to Modification 3 of Embodiment 1. It is noted that a transparent substrate is omitted in FIG. 28B.

As shown in FIG. 28A, the desired pattern is a plurality of rectangular resist patterns 200 disposed close to each other in the form of a matrix. The respective resist patterns 200 are adjacent to one another with their short sides opposing each other and their long sides opposing each other.

As shown in FIG. 28B, in the photomask of this modification, a transparent portion 104 (a second transparent portion 104B) is provided over a sufficiently large area on the transparent substrate (not shown). Furthermore, a mask pattern including a plurality of rectangular phase shifter portions 103 is provided on the transparent substrate 1 in a position corresponding to the resist patterns (the desired pattern) 200 to be formed on a wafer through exposure. In other words, the mask pattern of this embodiment includes the phase shifter portions 103 instead of a light-shielding portion in the same manner as in Modification 1 of Embodiment 1. In this modification, the mask pattern corresponding to the resist patterns 200 includes a plurality of pattern regions (a plurality of phase shifter portions 103) disposed close to one another in the form of a matrix. Also, as a characteristic of this modification, a semi-light-shielding portion 102 is provided between a first transparent portion 104A disposed in a region sandwiched between pattern regions having short sides opposing each other out of the plural pattern regions (a pattern opposing region 105 having the minimum opposing distance) and each pattern region (i.e., each phase shifter portion 103). In other words, in the pattern opposing region 105, the first transparent portion 104A is provided in a position away from each phase shifter portion 103 corresponding to each pattern region with the semi-light-shielding portion 102 sandwiched therebetween. Also, in this modification, the semi-light-shielding portion 102 is provided also around corners of each phase shifter portion 103 (namely, each pattern region) including its corners on a side of the pattern opposing region 105. Furthermore, in this modification, a second transparent portion 104B is provided between pattern regions having long sides opposing each other out of the plural pattern regions (having a longer opposing distance than the pattern opposing region 105).

In the structure of the photomask of this modification described above, also in the case where the phase shifter portion is used as a mask pattern instead of a light-shielding portion, the MEF can be reduced in the pattern opposing region, and the roundness of corners of a resist pattern to be formed and the recess of an end derived from the roundness can be suppressed. Accordingly, in the case where the photomask of this modification is applied to the formation of a pattern having a circuit layout including a plurality of transistors adjacent to one another, the opposing region between gate layer patterns and the external length of a gate in the opposing region can be reduced, so that transistors can be disposed at a high density for realizing high integration of an LSI.

Furthermore, the semi-light-shielding portion 102 is provided so as to surround the first transparent portion 104A disposed in the pattern opposing region 105 in this modification as in Embodiment 1. Such a structure is preferred particularly when a space dimension between resist patterns is fine.

Moreover, the semi-light-shielding portion 102 is provided so as to surround the periphery of the mask pattern (namely, the periphery of the phase shifter portions 103 corresponding to the respective pattern regions) in this modification as in Embodiment 1. When such a structure is employed, the optical proximity correction (OPC) can be easily performed in mask pattern creation.

It is noted that the semi-light-shielding portion 102 is defined in this modification in the same manner as in Embodiment 1. Also, the phase shifter portion 103 transmits light, and there is an opposite phase relationship (specifically, a relationship with a phase difference not less than (150+360×n) degrees and not more than (210+360×n) degrees (wherein n is an integer)) between light passing through the phase shifter portion 103 and light passing through the transparent portions 104A and 104B.

Although a phase shifter portion with low transmittance is assumed as the phase shifter portion 103 used instead of a light-shielding portion in Modification 1 of Embodiment 1, a phase shifter portion with high transmittance is assumed as the phase shifter portion 103 in this modification in the same manner as in Modification 2 of Embodiment 1. Specifically, the photomask of this modification has a cross-sectional structure similar to that of the photomask of Modification 2 of Embodiment 1 shown in FIG. 17C.

Moreover, in this modification, the phase shifter portion 103 with high transmittance is used when a resist pattern to be formed is a fine line pattern with a line width not more than a half of λ/NA. In forming a fine line pattern with a line width not more than a half of λ/NA, the phenomenon in question occurring as the roundness of corners in the shape of a resist pattern is remarkably caused as a phenomenon of taper of a line end or a phenomenon of recess of a line end.

The photomask of this modification having the aforementioned structure exhibits good pattern formation characteristics, and specifically, the MEF reducing effect and the effect to suppress the roundness of resist pattern corners (the effect to suppress the taper of a line end in particular), in forming a pattern on a wafer in the same manner as in Modification 2 of Embodiment 1.

In order to simultaneously attain the MEF reducing effect and the effect to suppress the roundness of resist pattern corners by using the photomask of this modification, the transmittance of the semi-light-shielding portion is preferably not less than 5% and not more than 30%, and in order to sufficiently attain the both effects, the transmittance of the semi-light-shielding portion is preferably not less than 10% and not more than 20% as in Modification 2 of Embodiment 1.

Furthermore, in order to stably form a resist pattern even when the CD value of the opposing distance between resist patterns is reduced in this modification, a transparent portion provided in a pattern opposing region is surrounded with a semi-light-shielding portion and the width, along the direction vertical to the pattern opposing direction, of the transparent portion is set to be smaller than the length of a side extending along the vertical direction (i.e., the opposing width) of each rectangular pattern (each phase shifter portion) in the same manner as in Modification 2 of Embodiment 1.

Furthermore, since the semi-light-shielding portion disposed in a pattern opposing region is provided so as to surround the periphery of the mask pattern (i.e., the periphery of respective phase shifter portions corresponding to the pattern regions) also in this modification as in Modification 2 of Embodiment 1, the optical proximity correction for adjusting the dimensions of a resist pattern including the dimension of a part in the vicinity of the opposing region can be easily performed.

The dimension along the pattern opposing direction of the semi-light-shielding portion disposed around the pattern opposing region may be longer or shorter than the opposing distance between the pattern regions also in this modification as in Modification 2 of Embodiment 1. However, in the same manner as in Embodiment 1, for preventing the roundness of resist pattern corners, the dimension (the width), along the direction vertical to the pattern opposing direction, of the semi-light-shielding portion disposed in and around the pattern opposing region is preferably larger than the dimension (the opposing width) along the vertical direction of the pattern region made of the phase shifter portion (namely, the semi-light-shielding portion is preferably provided not only in the pattern opposing region but also outside (in the periphery) of the opposing region).

Moreover, in this modification, the semi-light-shielding portion 102 provided in the pattern opposing region need not be in contact with the rectangular pattern made of the phase shifter portion 103, but the semi-light-shielding portion 102 and the phase shifter portion 103 may be spaced from each other by providing, between the semi-light-shielding portion 102 and the phase shifter portion 103, a transparent portion with a dimension not affecting an optical image formed by using the photomask.

Furthermore, the semi-light-shielding portion 102 provided in the pattern opposing region need not completely surround the first transparent portion 104A, but a transparent portion with a dimension not affecting an optical image formed by using the photomask may be disposed so as to divide the semi-light-shielding portion 102.

Moreover, in this modification, the semi-light-shielding portions 102 provided around the respective pattern opposing regions 105 may be mutually connected along a direction of opposing the long sides of the plural pattern regions. In other words, the semi-light-shielding portion 102 may be continuously provided for the mask pattern including a plurality of phase shifter portions 103.

Also, in this modification, one of a pair of pattern regions sandwiching the pattern opposing region 105 may be a phase shifter portion 103 and the other may be a light-shielding portion.

Embodiment 2

A photomask fabrication method according to Embodiment 2 of the invention will now be described with reference to the accompanying drawings.

Figure 29:
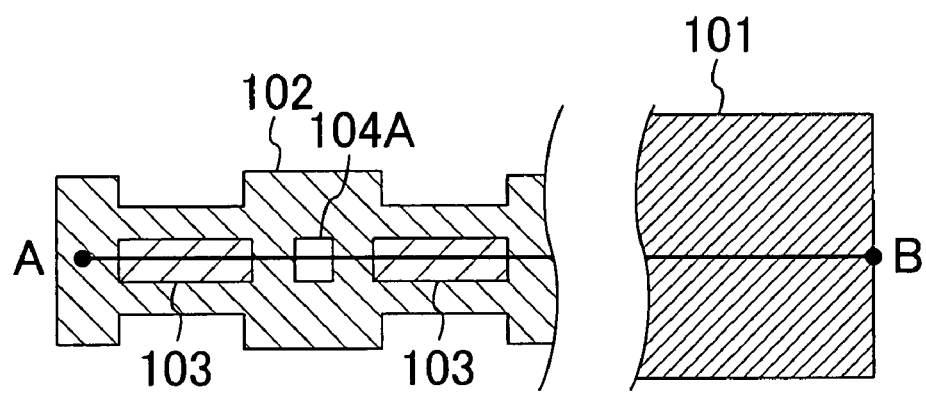
FIG. 29 is a plan view of a photomask to be fabricated by a photomask fabrication method according to Embodiment 2 of the invention.

FIG. 29 is a plan view of a photomask to be fabricated by the photomask fabrication method of this embodiment. The basic structure of the photomask of FIG. 29 is the same as the basic structure of the photomask according to Modification 2 of Embodiment 1 shown in FIG. 17B. Specifically, a mask pattern of the photomask of FIG. 29 includes a pair of rectangular phase shifter portions 103 (a pair of pattern regions) opposing and close to each other. Furthermore, a semi-light-shielding portion 102 is provided between a first transparent portion 104A disposed in a region sandwiched between the pair of pattern regions (a pattern opposing region) and each pattern region (namely, each phase shifter portion 103). Also, the semi-light-shielding portion 102 is provided also around corners of each phase shifter portion 103 (namely, each pattern region) including its corners on a side of the pattern opposing region. Specifically, the semi-light-shielding portion 102 is provided so as to surround the first transparent portion 104A disposed in the pattern opposing region and surround the periphery of the mask pattern (namely, the periphery of the phase shifter portions 103 corresponding to the pattern regions).

It is noted that a transparent substrate 100 (a second transparent portion 104B) is omitted in FIG. 29. As shown in FIG. 29, for example, a light-shielding portion 101 used as an alignment mark is provided on the transparent substrate in a region other than a mask pattern forming region.

FIGS. 30A through 30J are cross-sectional views (of the cross-sectional structure taken on line AB of FIG. 29) for showing procedures in the photomask fabrication method of this embodiment. FIGS. 31A through 31C are plan views respectively corresponding to FIGS. 30C, 30G and 30J, whereas the mask pattern forming region alone is shown in FIGS. 31A through 31C.

Figure 30A:
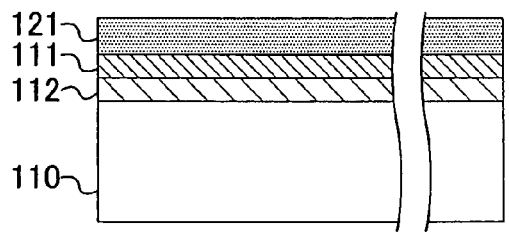
FIGS. 30A, 30B, 30C, 30D, 30E, 30F, 30G, 30H, 30I and 30J are cross-sectional views for showing procedures in the photomask fabrication method of Embodiment 2 of the invention.
Figure 31A:
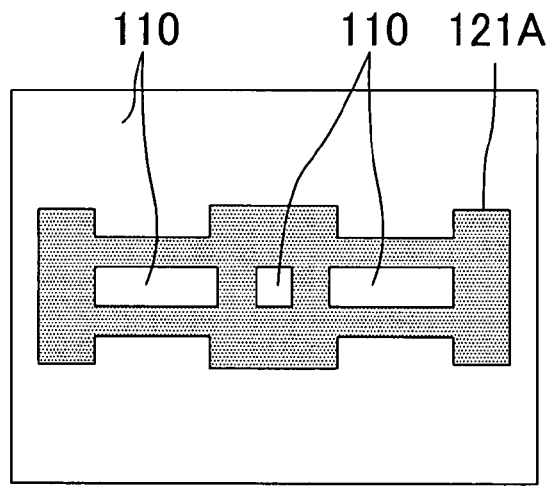
FIGS. 31A, 31B and 31C are plan views respectively corresponding to the cross-sectional views of FIGS. 30C, 30G and 30J.
Figure 31B:
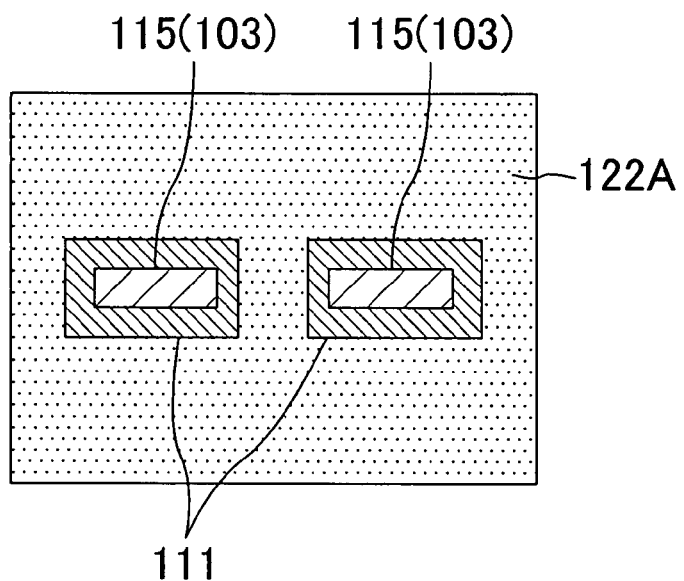
Figure 31C:
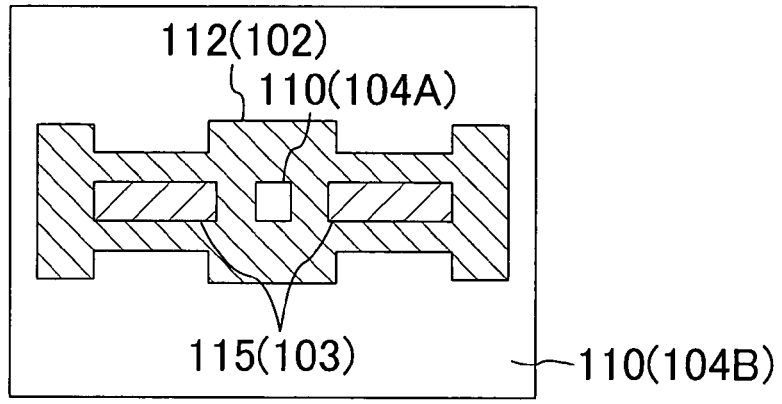

First, as shown in FIG. 30A, a metal thin film 112 of Mo and a Cr film 111 are successively formed as a semi-light-shielding film and a light-shielding film, respectively on a transparent substrate of, for example, a quartz substrate 110, and thereafter, a resist film 121 is formed on the Cr film 111.

Figure 30F:
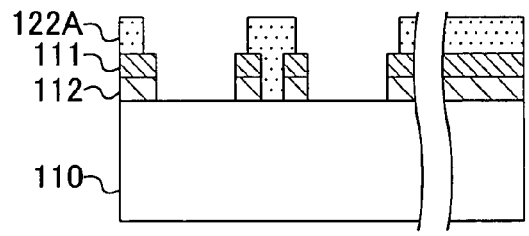
Figure 30B:
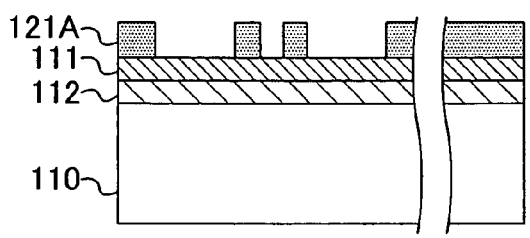

Next, as shown in FIG. 30B, the resist film 121 is patterned by lithography, so as to form a resist pattern 121A for covering a region for a light-shielding portion 101 and a region for a semi-light-shielding portion 102.

Figure 30G:
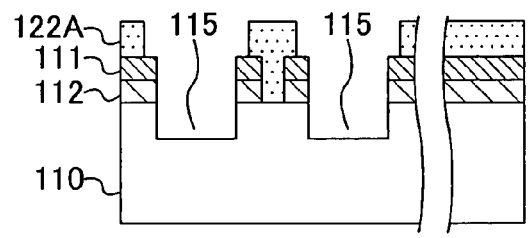
Figure 30C:
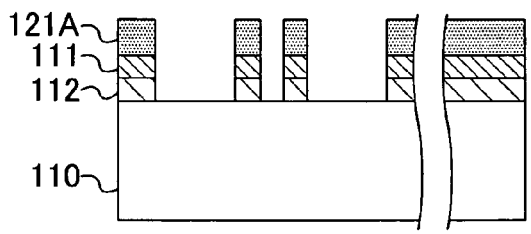
Figure 30H:
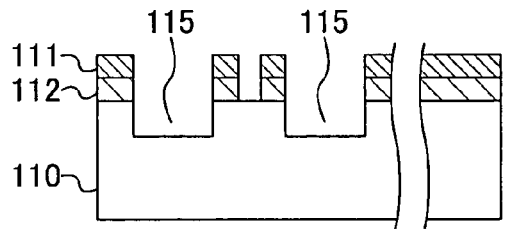
Figure 30D:
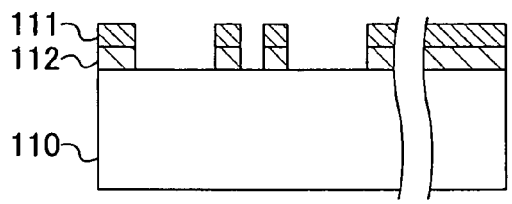

Then, the Cr film 111 and the metal thin film 112 are successively etched by using the resist pattern 121A as a mask, so as to remove the Cr film 111 and the metal thin film 112 in regions for transparent portions 104A and 104B and regions for phase shifter portions 103 (a pair of pattern regions included in a mask pattern) as shown in FIGS. 30C and 31A. Thereafter, the resist pattern 121A is removed as shown in FIG. 30D. Thus, the surface of the quartz substrate 110 is exposed in the regions for the transparent portions 104A and 104B and the regions for the phase shifter portions 103.

Figure 30I:
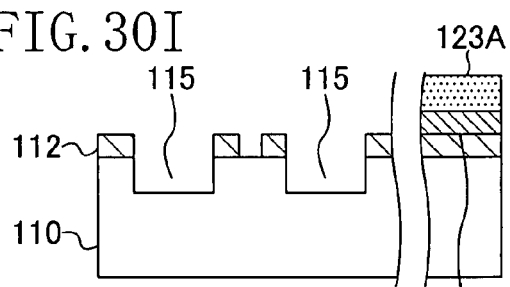
Figure 30E:
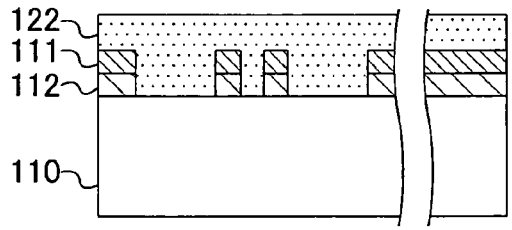

Next, as shown in FIG. 30E, a resist film 122 is formed on the patterned Cr film 111 and the quartz substrate 110, and thereafter, the resist film 122 is patterned by the lithography, so as to form a resist pattern 122A for covering the region for the second transparent portion 104B as shown in FIG. 30F. At this point, the Cr film 111 (covering the region for the light-shielding portion 101 and the region for the semi-light-shielding portion 102) excluding a part thereof disposed in the vicinity (substantially corresponding to a mask alignment margin) of the region for the phase shifter portion 103 may be covered with the resist pattern 122A.

Next, the quartz substrate 110 is etched by using the resist pattern 122A and a part of the Cr film 111 as a mask, so as to trench the quartz substrate 110 in positions corresponding to the regions for the phase shifter portions 103 (the pair of pattern regions included in the mask pattern) by a depth for inverting the phase of transmitted light. Thus, trench portions 115 used as the phase shifter portions 103 are formed as shown in FIGS. 30G and 31B, and then, the resist pattern 122A is removed as shown in FIG. 30H. At this point, the opening width of each trench portion 115 is substantially the same as the opening width of the Cr film 111.

Figure 30J:
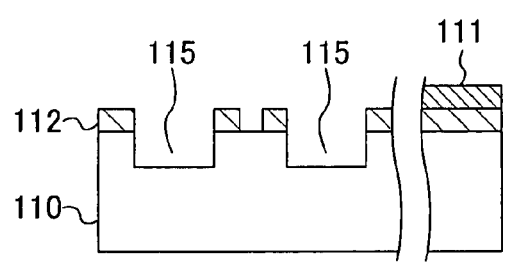

Then, as shown in FIG. 30I, after forming a resist pattern 123A for covering the region for the light-shielding portion 101, the Cr film 111 (covering the region for the light-shielding portion 101 and the region for the semi-light-shielding portion 102) is etched by using the resist pattern 123A as a mask, so as to remove the Cr film 111 in the region for the semi-light-shielding portion 102. Thereafter, the resist pattern 123A is removed. Thus, the Cr film 111 remains merely in the region for the light-shielding portion 101 as shown in FIGS. 30J and 31C, and the metal thin film 112 is exposed in the region for the semi-light-shielding portion 102. In this manner, the photomask shown in FIG. 29 is completed.

Although the photomask according to Modification 2 of Embodiment 1 shown in FIGS. 17B and 17C is exemplified in this embodiment, in the case where the pair of pattern regions included in the mask pattern are both light-shielding portions 101 (namely, in the case where the photomask according to Embodiment 1 shown in FIGS. 1B and 1C is to be fabricated), the Cr film 111 and the metal thin film 112 are allowed to remain in the pair of pattern regions included in the mask pattern in the procedure shown in FIGS. 30C and 31A; the procedures shown in FIGS. 30E, 30F, 30G and 31B, and 30H are omitted; and the Cr film 111 and the metal thin film 112 are allowed to remain in the pair of pattern regions included in the mask pattern in the procedure shown in FIG. 30I. Alternatively, in the case where one of the pair of pattern regions included in the mask pattern is a phase shifter portion 103 and the other is a light-shielding portion 101, the Cr film 111 and the metal thin film 112 are removed in one of the pattern regions with the Cr film 111 and the metal thin film 112 allowed to remain in the other pattern region in the procedure shown in FIGS. 30C and 31A; the quartz substrate 110 is trenched in the former pattern region by a depth for inverting the phase of transmitted light so as to form the trench portion 115 used as the phase shifter portion 103 in the procedure shown in FIGS. 30G and 31B; and the Cr film 111 and the metal thin film 112 are allowed to remain in the latter pattern region in the procedure shown in FIG. 30I.

Embodiment 3

A pattern formation method according to Embodiment 3 of the invention, and more specifically, a pattern formation method using the photomask according to any of Embodiment 1 and its modifications (hereinafter referred to as the photomask of the invention) will now be described with reference to the accompanying drawings.

FIGS. 24A through 24D are cross-sectional views for showing procedures in the pattern formation method of Embodiment 3.

Figure 24A:
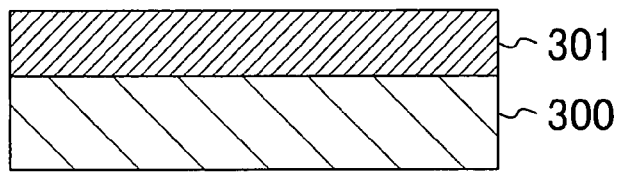
FIGS. 24A, 24B, 24C and 24D are cross-sectional views for showing procedures in a pattern formation method according to Embodiment 3 of the invention.
Figure 24B:
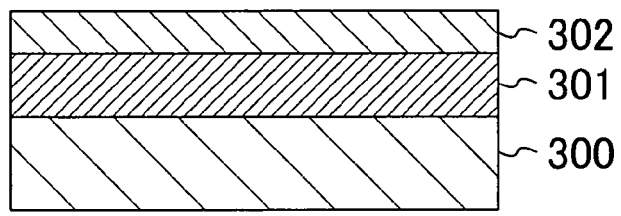

First, as shown in FIG. 24A, a target film 301 of, for example, a metal film or an insulating film is formed on a substrate 300, and thereafter, a positive resist film 302 is formed on the target film 301 as shown in FIG. 24B.

Figure 24C:
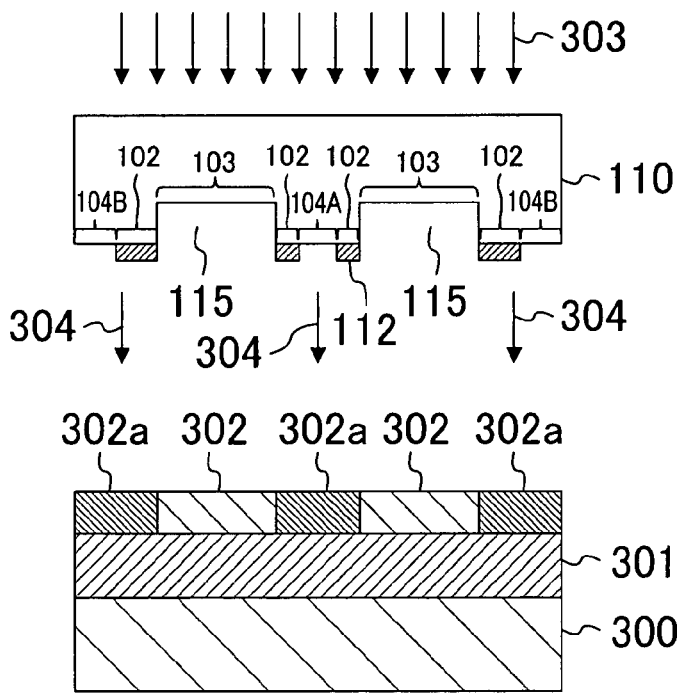

Next, as shown in FIG. 24C, the resist film 302 is irradiated with exposing light 303 through the photomask of this invention, for example, the photomask of Modification 2 of Embodiment 1 having the structure shown in FIGS. 17A through 17C. Thus, the resist film 302 is exposed with the exposing light 304 having passed through the photomask. At this point, a mask pattern of the photomask includes a pair of phase shifter portions 103 and the pair of phase shifter portions 103 are surrounded with a semi-light-shielding portion 102. Also, a first transparent portion 104A is provided between the pair of phase shifter portions 103 so as to be surrounded with the semi-light-shielding portion 102. The semi-light-shielding portion 102 corresponds to a bare region of a metal thin film (a semi-light-shielding film) 112 deposited on a quartz substrate 110, and the phase shifter portion 103 corresponds to a trench portion 115 of the quartz substrate 110 in a part thereof where the metal thin film 112 has been removed.

In the exposure procedure shown in FIG. 24C, the resist film 302 is subjected to the exposure by using a light source of, for example, oblique incident exposure (off-axis illumination). In this case, as shown in FIG. 24C, merely a latent image portion 302a of the resist film 302 corresponding to a region of the photomask excluding the mask pattern (i.e., the transparent portions 104A and 104B and the semi-light-shielding portion 102) is irradiated at exposure energy sufficiently high for allowing the resist to dissolve in development.

Figure 24D:
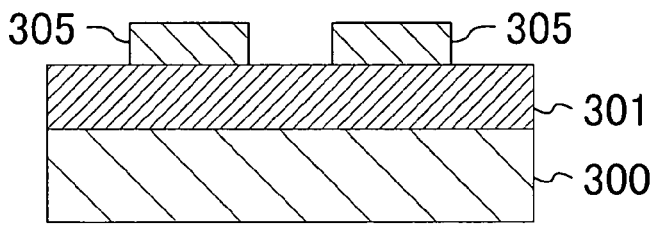

Next, the resist film 302 is developed so as to remove the latent image portion 302a, thereby forming resist pattern 305 corresponding to the mask pattern of the photomask (i.e., a pair of resist patterns corresponding to a pair of phase shifter portions 103) as shown in FIG. 24D.

In this embodiment, since the photomask of this invention (specifically, the photomask of any of Embodiment 1 and its modifications) is used in the pattern formation method, the same effects as those attained in Embodiment 1 or its modifications can be attained.

Figure 25A:
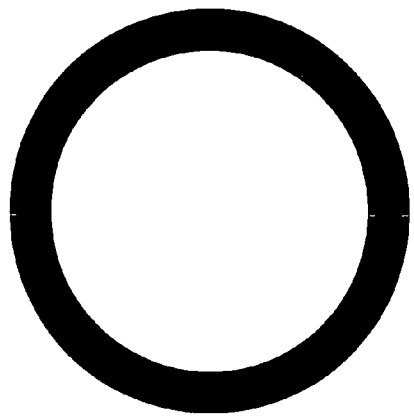
FIG. 25A is a diagram for showing the shape of a general exposure light source and FIGS. 25B, 25C and 25D are diagrams for showing the shapes of light sources for oblique incident illumination.
Figure 25B:
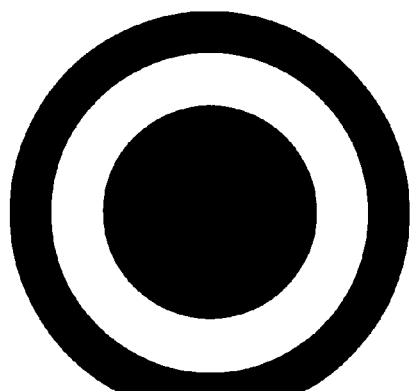
Figure 25C:
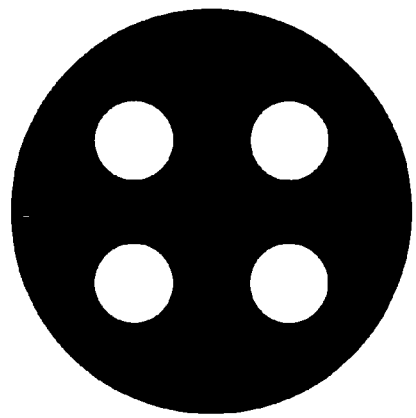
Figure 25D:
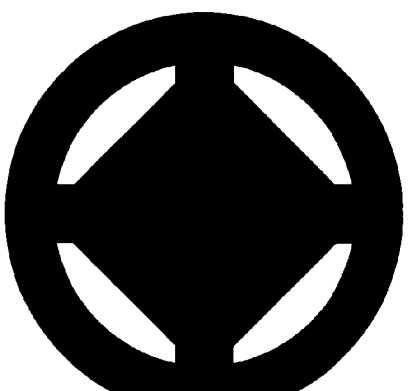
Figure 26A:
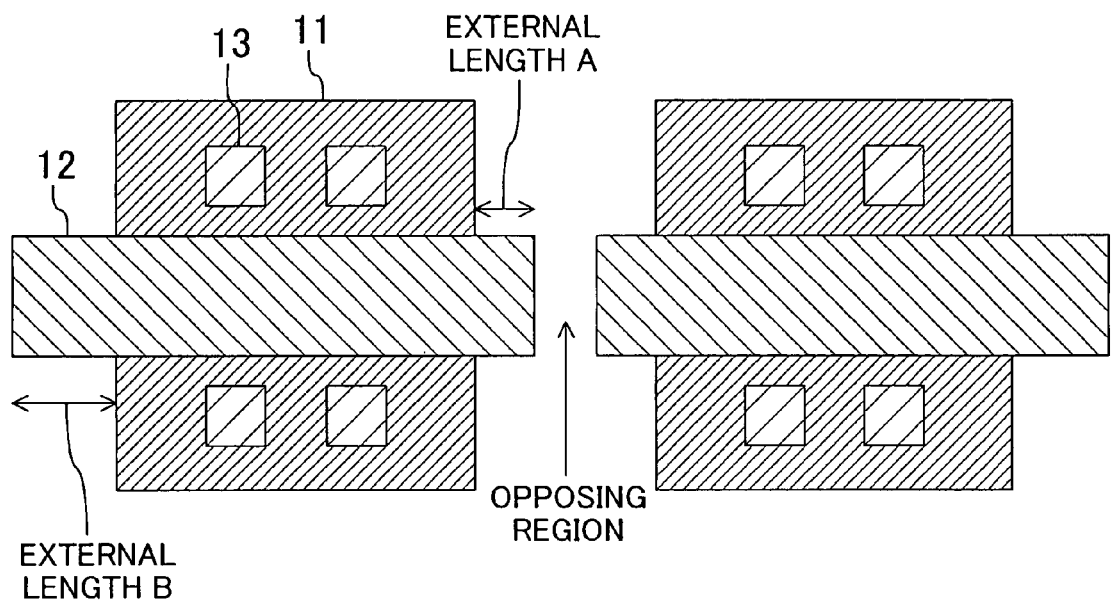
FIGS. 26A and 26B are diagrams for explaining harmful influence of roundness of resist pattern corners on integration of an LSI.
Figure 26B:
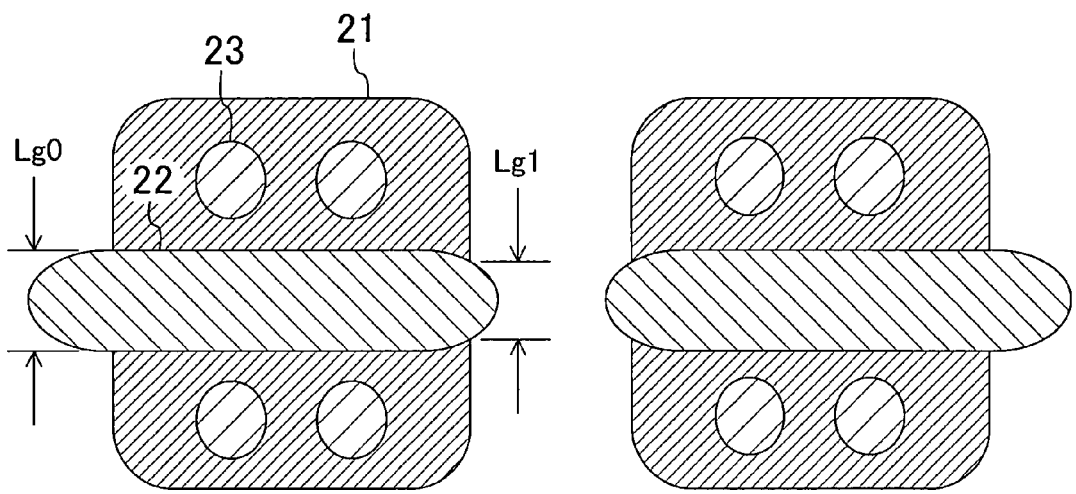
Figure 27A:
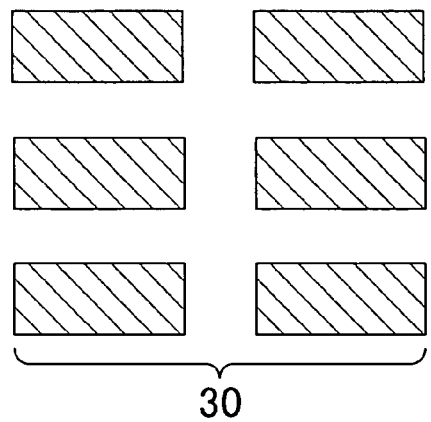
FIGS. 27A and 27B are diagrams for explaining conventional technique using a transmittance adjustment film for preventing the roundness of resist pattern corners.
Figure 27B:
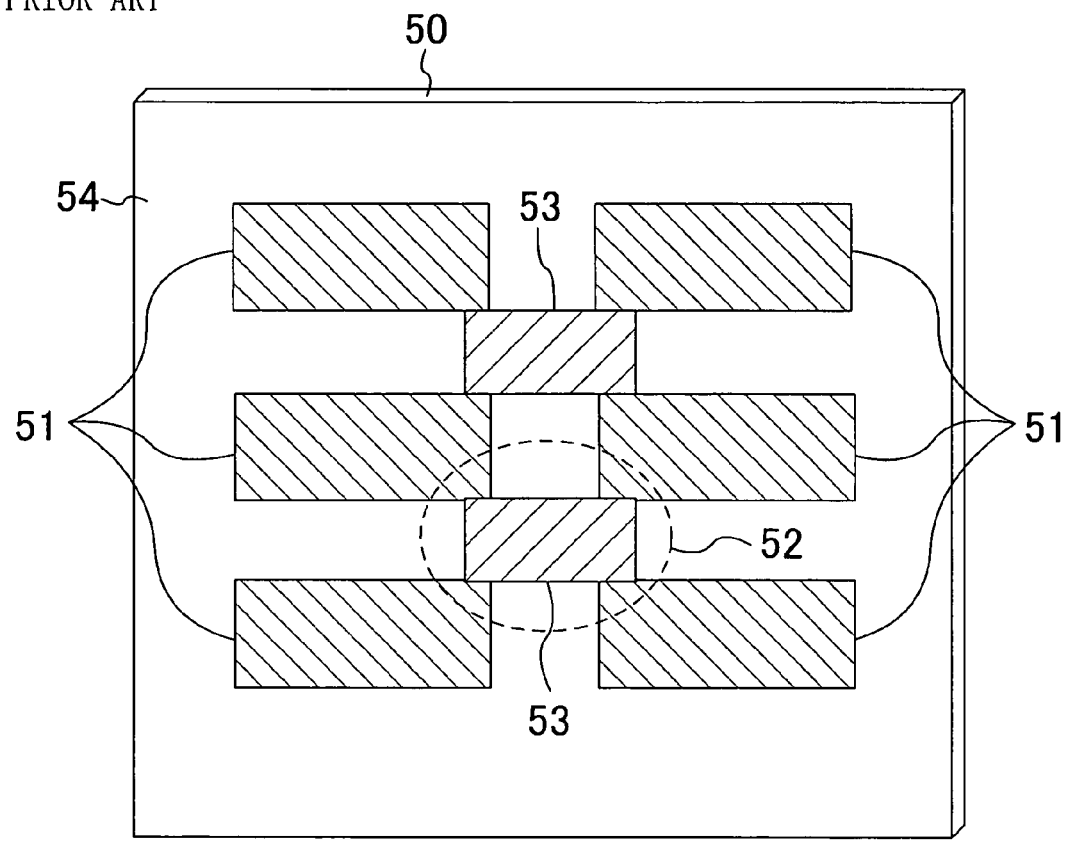

Furthermore, in this embodiment, when an oblique incident exposure light source is used in the exposure, performed through the photomask of this invention, of a substrate (a wafer) on which a resist has been applied, the effects of this invention (namely, the effect to suppress the roundness of resist pattern corners and the recess of ends derived from the roundness and the MEF reducing effect in a pattern opposing region) can be particularly remarkably exhibited, and therefore, a finer pattern can be formed. Herein, an oblique incident exposure light source means a light source as shown in any of FIGS. 25B through 25D obtained by removing a vertical incident component (a component of the exposing light vertically entering the photomask from the light source) from a general exposure light source of FIG. 25A. Typical examples of the oblique incident exposure light source are an annular exposure light source of FIG. 25B and quadrupole exposure light sources of FIGS. 25C and 25D. Although slightly depending upon a target pattern, the quadrupole exposure light source is generally more effectively used than the annular exposure light source for improving the contrast and increasing the DOF.

INDUSTRIAL APPLICABILITY

As described so far, the present invention relates to a photomask and a pattern formation method, and is very useful in application to fine pattern formation employed in the fabrication of a semiconductor integrated circuit device or the like.

The invention claimed is:

1. A photomask comprising a mask pattern provided on a transparent substrate having a transparent property against exposing light, further comprising, on said transparent substrate:
   a semi-light-shielding portion for partially transmitting the exposing light;
   a first transparent portion surrounded with said semi-light-shielding portion and having a transparent property against the exposing light; and
   a second transparent portion surrounding said mask pattern and having a transparent property against the exposing light,
   wherein said mask pattern includes a first pattern region and a second pattern region opposing each other with at least a part of said semi-light-shielding portion and said first transparent portion sandwiched therebetween, and said semi-light-shielding portion, said first transparent portion and said second transparent portion transmit the exposing light in an identical phase.

2. The photomask of claim 1, wherein said semi-light-shielding portion is provided around corners, disposed on a side of said first transparent portion, of at least one of said first pattern region and said second pattern region.

3. The photomask of claim 1, wherein said second transparent portion surrounds the periphery of a region including said semi-light-shielding portion, said first pattern region and said second pattern region.

4. The photomask of claim 1, wherein said second transparent portion surrounds the periphery of said first pattern region and said second pattern region in such a manner as to space said first pattern region and said second pattern region from said semi-light-shielding portion.

5. The photomask of claim 1, wherein said semi-light-shielding portion surrounds said first pattern region and said second pattern region.

6. The photomask of claim 5, wherein said semi-light-shielding portion has a larger width around corners of said first pattern region and said second pattern region than around said first pattern region and said second pattern region excluding said corners.

7. The photomask of claim 1, wherein said semi-light-shielding portion transmits the exposing light in a phase difference not less than (−30+360×n) degrees and not more than (30+360×n) degrees with respect to said transparent portion (wherein n is an integer).

8. The photomask of claim 1, wherein said semi-light-shielding portion has transmittance not less than 5% and not more than 30% against the exposing light.

9. The photomask of claim 1, wherein a distance between said first pattern region and said second pattern region is not more than M×λ/NA (wherein λ indicates a wavelength of the exposing light and M and NA respectively indicate a reduction ratio and numerical aperture of a reduction projection optical system of a projection aligner).

10. The photomask of claim 1, wherein said first transparent portion has a dimension along a first direction, which is smaller than the dimension of an opposing surface of said first pattern region extending in the first direction, and which is smaller than the dimension of an opposing surface of said second pattern region extending in the first direction.

11. The photomask of claim 1, wherein each of said first pattern region and said second pattern region is in a rectangular shape.

12. The photomask of claim 11, wherein a short side of said first pattern region opposes a short side of said second pattern region.

13. The photomask of claim 12, wherein said short side of said first pattern region and said short side of said second pattern region have the same dimension.

14. The photomask of claim 12, wherein said short side of said first pattern region has a smaller dimension than said short side of said second pattern region.

15. The photomask of claim 11, wherein a short side of said first pattern region opposes a long side of said second pattern region.

16. The photomask of claim 1, wherein said semi-light-shielding portion is made of a metal thin film with a thickness of 30 nm or less.

17. The photomask of claim 1, wherein each of said first pattern region and said second pattern region is made of a light-shielding portion substantially not transmitting the exposing light.

18. The photomask of claim 1, wherein each of said first pattern region and said second pattern region is made of a phase shifter portion for transmitting the exposing light in an opposite phase to the exposing light passing through said transparent portion.

19. The photomask of claim 1, wherein one of said first pattern region and said second pattern region is made of a light-shielding portion substantially not transmitting the exposing light and the other is made of a phase shifter portion for transmitting the exposing light in an opposite phase to the exposing light passing through said transparent portion.

20. The photomask of claim 17, wherein said light-shielding portion has transmittance of 1% or less against the exposing light.

21. The photomask of claim 17, wherein said semi-light-shielding portion is made of a semi-light-shielding film formed on said transparent substrate, and said light-shielding portion is made of a light-shielding film further stacked on said semi-light-shielding film.

22. The photomask of claim 18, wherein said phase shifter portion transmits the exposing light in a phase difference not less than $(150 + 360 \times n)$ degrees and not more than $(210 + 360 \times n)$ degrees with respect to said transparent portion (wherein n is an integer).

23. The photomask of claim 18, wherein said semi-light-shielding portion is made of a semi-light-shielding film formed on said transparent substrate, and said phase shifter portion is made of a phase shifting film further stacked on said semi- light-shielding film.

24. The photomask of claim 18, wherein said semi-light-shielding portion is made of a semi-light-shielding film formed on said transparent substrate, and said phase shifter portion is made of an opening formed in said semi-light-shielding film.

25. The photomask of claim 24, wherein said transparent substrate is trenched in said opening formed for said phase shifter portion.

26. A method for fabricating the photomask of claim 18, comprising the steps of:
 (a) forming a semi-light-shielding film on said transparent substrate;
 (b) removing said semi-light-shielding film in a region for said first transparent portion, a region for said second transparent portion, said first pattern region and said second pattern region; and
 (c) forming said phase shifter portion by trenching said transparent substrate in said first pattern region and said second pattern region by a given depth after the step (b).

27. A pattern formation method using the photomask of claim 1, comprising the steps of:
 (a) forming a resist film on a substrate;
 (b) irradiating said resist film with the exposing light through said photomask; and
 (c) forming a resist pattern by developing said resist film having been irradiated with the exposing light.

28. The pattern formation method of claim 27, wherein oblique incident illumination is employed in the step (b).

29. The pattern formation method of claim 27,
 wherein said resist film is a positive resist film, and
 a first resist pattern corresponding to said first pattern region and a second resist pattern corresponding to said second pattern region are formed as said resist pattern in the step (c).

* * * * *